United States Patent
Yamazaki et al.

(10) Patent No.: US 6,323,142 B1
(45) Date of Patent: *Nov. 27, 2001

(54) APCVD METHOD OF FORMING SILICON OXIDE USING AN ORGANIC SILANE, OXIDIZING AGENT, AND CATALYST-FORMED HYDROGEN RADICAL

(75) Inventors: Shunpei Yamazaki, Tokyo; Mitsunori Sakama; Takeshi Fukada, both of Kanagawa, all of (JP)

(73) Assignee: Semiconductor Energy Laboratory Co., Ltd., Kanagawa-ken (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/706,666

(22) Filed: Sep. 6, 1996

(30) Foreign Application Priority Data

Sep. 8, 1995 (JP) .................................................. 7-256969
Sep. 16, 1995 (JP) .................................................. 7-262519

(51) Int. Cl.[7] ....................... H01L 21/00; H01L 21/3205; H01L 21/4763; H01L 21/31; H01L 21/469
(52) U.S. Cl. ......................... 438/790; 438/789; 438/149; 438/585; 427/579
(58) Field of Search .................................... 438/789, 790, 438/786, 149, 585; 148/DIG. 118; 427/579

(56) References Cited

U.S. PATENT DOCUMENTS

| | | | |
|---|---|---|---|
| 4,196,232 | * 4/1980 | Schnable et al. | 527/255.3 |
| 5,314,724 | * 5/1994 | Tsukune et al. | 427/489 |
| 5,344,797 | 9/1994 | Pai et al. | 437/238 |
| 5,374,847 | * 12/1994 | Araki et al. | 257/639 |
| 5,382,550 | * 1/1995 | Iyer | 438/763 |
| 5,474,955 | 12/1995 | Thakur | 437/173 |
| 5,593,741 | * 1/1997 | Ikeda | 427/579 |
| 5,608,232 | 3/1997 | Yamazaki et al. | |
| 5,629,246 | * 5/1997 | Iyer | 427/763 |
| 5,639,698 | 6/1997 | Yamazaki et al. | |
| 5,837,614 | 11/1998 | Yamazaki et al. | |
| 5,843,225 | 12/1998 | Takayama et al. | |
| 5,866,932 | 2/1999 | Yamazaki et al. | |
| 5,879,977 | 3/1999 | Zhang et al. | |

(List continued on next page.)

FOREIGN PATENT DOCUMENTS

| | | |
|---|---|---|
| 64-48425 | 2/1989 | (JP) . |
| 6-132219 | * 5/1994 | (JP) . |
| 6-232059 | 8/1994 | (JP) . |
| 6-244103 | 9/1994 | (JP) . |
| 6-244104 | 9/1994 | (JP) . |
| 6-267982 | * 9/1994 | (JP) . |
| 6-333740 | * 12/1994 | (JP) . |
| 239225 | 1/1995 | (TW) . |

OTHER PUBLICATIONS

Mori, et al., "Silica Coating of powdered Material in Atmospheric Pressure Glow Plasma", Symp. Plasma Sci. Mater., 8th, 1995, pp. 51–55.

Han, et al., "Dependence of MOSFET Hot–Carrier Aging on PECVD Process", Proc. SPIE–Int. Soc. Opt. Eng., vol. 2636, 1995, pp. 299–306.

Ibaraki, N., "15.1: *Invited Paper*: Low Temperature Poly–Si TFT Technology", SID 99 Digest, 1999, pp. 172–175.

*Primary Examiner*—Charles Bowers
*Assistant Examiner*—Erik Kielin
(74) *Attorney, Agent, or Firm*—Fish & Richardson P.C.

(57) ABSTRACT

In forming various types of insulating films in manufacture of a semiconductor device, carbon is gasified into $CH_x$, COH etc. during film formation by adding active hydrogen and nitrogen oxide to reduce the carbon content during the film formation, and the effect of blocking impurities such as alkali metals is improved.

15 Claims, 6 Drawing Sheets

U.S. PATENT DOCUMENTS

| | | |
|---|---|---|
| 5,897,347 | 4/1999 | Yamazaki et al. . |
| 5,956,579 | 9/1999 | Yamazaki et al. . |
| 6,025,630 | 2/2000 | Yamazaki et al. . |
| 6,084,247 | 7/2000 | Yamazaki et al. . |
| 6,110,770 | 8/2000 | Zhang et al. . |

* cited by examiner

APCVD METHOD OF FORMING SILICON OXIDE USING AN ORGANIC SILANE, OXIDIZING AGENT, AND CATALYST-FORMED HYDROGEN RADICAL

BACKGROUND OF THE INVENTION

1. Field of the Invention

The present invention relates to film formation using an organic silane type source gas. More specifically, the invention relates to a manufacturing method of a semiconductor device including formation of a film containing hydrogen and nitrogen which film is low in the content of carbon components and superior both in step coverage and impurity blocking performance.

2. Description of the Related Art

In LSIs, which constitute one technical field of semiconductor devices, the wiring interval is now as small as 0.2–0.4 $\mu$m and the aspect ratio (height to width) of wiring lines (interconnections) now exceeds unity. To prevent voids from occurring in planarizing an interlayer insulating film, a film forming method comes to be used which utilizes superior step coverage of a film that is formed by using an organic silane type source gas such as ethyl orthosilicate ($Si(OC_2H_5)_4$, what is called "TEOS"). In another field of liquid crystal displays in which a number of thin-film transistors are formed on an insulative substrate, the frequency of occurrence of what is called a "break at a step" of wiring lines of thin-film transistors is lowered by utilizing superior step coverage of a film formed by using ethyl orthosilicate as a source gas. In particular, in liquid crystal displays using a process of lower than 600° C. in contrast to high-temperature processes for silicon wafers, an ethyl orthosilicate source gas is used to form a gate oxide film and an undercoat film in addition to an interlayer insulating film.

In the field of LSIs, although an oxide film formed by using ethyl orthosilicate is used as an interlayer insulating film, it contains many carbon-hydrogen bonds and oxygen-hydrogen bonds and therefore is high in hygroscopicity. On the other hand, although a silicon nitride film exhibits high water resistance and impurity blocking performance, it is inferior in step coverage and is easily broken because of its high degree of hardness.

In thin-film transistors (TFTs), which are applied to, for instance, a liquid crystal display, an undercoat film, a gate insulating film, an interlayer insulating film, and the like are formed on an insulative substrate such as a glass substrate by thermal CVD, plasma CVD, or a like method by using an organic silane type source gas such as ethyl orthosilicate. However, having a large amount of carbon, such films are not sufficient in terms of water resistance and impurity blocking performance.

In a conventional, commonly employed film forming method that is a plasma CVD method using ethyl orthosilicate, a subject substrate is placed in a chamber having parallel-plate electrodes and capable of being evacuated. On of the electrodes is connected to a high-frequency power supply, that is, serves as the cathode. The other electrode is connected to the ground, that is, serves as the anode. The subject substrate is placed on the ground-side, i.e., anode-side electrode. Since ethyl orthosilicate assumes liquid form in the ordinary temperature, it is introduced into the chamber in a state that it is heated to increase its vapor pressure or it is introduced into the chamber together with a carrier gas by bubbling ethyl orthosilicate in a tank with the carrier gas. Ethyl orthosilicate has a feature that when decomposed in plasma, it forms precursors and flows on the substrate, thus enabling formation of a film that is superior is step coverage. Precursors moving on the substrate collide with each other, and oxygen ions, oxygen radicals, ozone molecules formed in the plasma collide with those precursors, causing abstraction reaction on the surface and thereby forming $SiO_x$. If a larger amount of oxygen is introduced, the surface abstraction reaction due to the precursors that are formed from ethyl orthosilicate is accelerated. In this case, the step coverage is degraded though the carbon content is reduced.

On the other hand, if a smaller amount of oxygen is introduced, although the step coverage is improved, more carbon-hydrogen and oxygen-hydrogen bonds remain in the film, making it highly hygroscopic. If an infrared measurement is conducted, the absorption in the vicinity of 3,660 $cm^{-1}$ will increase with the lapse of time. The absorption at 3,660 $cm^{-1}$ is mainly due to Si—OH bonds and indicates that a film formed is hygroscopic.

Another film forming method using ethyl orthosilicate is an atmospheric pressure CVD method utilizing ozone and heat. In this method, a substrate is heated to 300–400° C. An organic silane type source gas such as ethyl orthosilicate is introduced into a reaction chamber by bubbling it in a tank with $N_2$. Ozone is also introduced into the chamber by generating it by passing oxygen through an ozonizer. Because of superior step coverage and a high film forming rate of this method, this method is used to form an interlayer insulating film for devices that include multi-layer wiring, such as LSIs and DRAMs memories. After the film formation, planarization is performed by etching back, SOG (spin on glass), CMP (chemical mechanical polishing), etc. in combination.

However, according to the above atmospheric pressure CVD method, a resulting film is very low in density, that is, a porous film is formed. Therefore, if such a film is used singly, it exhibits very high hygroscopicity, possibly causing leak between wiring lines, thus lowering the reliability of a semiconductor device. Further, at the present time when the application of the 0.3-$\mu$m rules is pressing, the lateral capacitance between wiring lines is not negligible, which requires a film having a small permittivity.

Japanese Unexamined Patent Publication No. Hei. 1-48425 of the present assignee discloses a film forming method that uses an organic silane type source gas and nitrogen oxide. As disclosed in the above publication, this method can form a uniform coating on an uneven surface which coating blocks alkaline impurities. Although this coating functions satisfactorily when used only as an interlayer insulating film, the carbon content in the organic silane type source gas needs to be minimized when this coating serves as an insulating film whose electrical characteristics are important, such as a gate insulating film or a part of a capacitor. The coating cannot be used as an insulating film whose electrical characteristics are utilized unless the carbon content is controlled.

Conventionally, where a film is formed by using an organic silane type source gas such as ethyl orthosilicate, improving the step coverage necessarily causes increase in hygroscopicity and carbon content, which in turn causes reduction in reliability and degradation in semiconductor characteristics. If a large amount of oxygen is added to an organic silane type gas such as ethyl orthosilicate to decrease the carbon content, the step coverage is degraded and therefore voids, a break of a wiring line, etc. may occur, which also cause reduction in reliability and degradation in semiconductor characteristics. In addition, an oxide film is more likely contaminated by impurities such as alkali metals. Once introduced, impurities behave as operative ions (movable ions) in some cases.

SUMMARY OF THE INVENTION

An object of the present invention is to enable formation of a film which is superior in step coverage, lower in carbon content than conventional films, low in hygroscopicity, and superior in impurity blocking performance.

Another object of the invention is to enable formation of a film which is superior in step coverage, lower in carbon content than conventional films, and low in hygroscopicity, with an increased film forming rate.

To attain the above objects, according to one aspect of the invention, there is provided a manufacturing method of a semiconductor device having a step of forming an oxide film on a heated substrate by plasma CVD or atmospheric pressure CVD by using gases including an organic silane type source gas and oxygen or a source gas including ozone that is generated from oxygen, wherein:

the oxide film is formed by adding hydrogen during formation thereof, and then converting said hydrogen into hydrogen radicals; or the oxide film is formed by converting hydrogen into hydrogen radicals, and adding the hydrogen radicals during formation of the oxide film.

According to another aspect of the invention, there is provided a manufacturing method of a semiconductor device having a step of forming an oxide film on a heated substrate by plasma CVD or atmospheric pressure CVD by using gases including an organic silane type source gas and oxygen or a source gas including ozone that is generated from oxygen, wherein:

the oxide film is formed by adding $H_2O$ during formation thereof, and then generating hydrogen radicals from said $H_2O$.

According to another aspect of the invention, there is provided a manufacturing method of a semiconductor device having a step of forming an oxide film on at least part of a hydrophilic surface of a heated substrate by atmospheric pressure CVD by using gases including an organic silane type source gas and oxygen or a source gas including ozone that is generated from oxygen with an ozone density set at more than 1%, wherein:

the oxide film is formed by adding hydrogen during formation thereof, and then converting said hydrogen into hydrogen radicals; or the oxide film is formed by converting hydrogen into hydrogen radicals, and adding the hydrogen radicals during formation of the oxide film.

According to another aspect of the invention, there is provided a manufacturing method of a semiconductor device having a step of forming an oxide film on a heated substrate by plasma CVD by using gases including an organic silane type source gas and oxygen or a source gas including ozone that is generated from oxygen, wherein:

an amount of said oxygen is less than 15 times an amount of the organic silane type source gas; and the oxide film is formed by adding hydrogen at an amount not less than 0.01 times the amount of the organic silane type source gas during formation thereof, and then converting said hydrogen into hydrogen radicals.

According to another aspect of the invention, there is provided a manufacturing method of a semiconductor device having a step of forming an oxide film on a heated substrate by plasma CVD by using gases including an organic silane type source gas and oxygen or a source gas including ozone that is generated from oxygen, wherein:

an amount of said oxygen is less than 15 times an amount of the organic silane type source gas; and the oxide film is formed by adding $H_2O$ by bubbling $H_2O$ with a carrier gas of an amount 0.1 to 1 times the amount of the organic silane type source gas during formation of the oxide film, and then generating hydrogen radicals from said $H_2O$.

According to another aspect of the invention, there is provided a manufacturing method of a semiconductor device having a step of forming an oxide film on a heated substrate by atmospheric pressure CVD by using gases including an organic silane type source gas and oxygen or a source gas including ozone that is generated from oxygen, wherein:

the oxide film is formed by adding hydrogen at an amount not less than 0.1 times the amount of the organic silane type source gas during formation thereof, and then converting said hydrogen into hydrogen radicals.

According to another aspect of the invention, there is provided a manufacturing method of a semiconductor device having a step of forming an oxide film on a heated glass substrate by plasma CVD or atmospheric pressure CVD by using gases including an organic silane type source gas and oxygen or a source gas including ozone that is generated from oxygen under a semiconductor layer to become an active layer in a process of forming a thin-film transistor on the glass substrate, wherein:

the oxide film is formed by adding hydrogen during formation thereof, and then converting said hydrogen into hydrogen radicals; or the oxide film is formed by converting hydrogen into hydrogen radicals, and adding the hydrogen radicals during formation of the oxide film.

According to another aspect of the invention, there is provided a manufacturing method of a semiconductor device having a step of forming an oxide film on a heated glass substrate by plasma CVD by using gases including an organic silane type source gas and oxygen or a source gas including ozone that is generated from oxygen over a semiconductor layer to become an active layer in a process of forming a thin-film transistor on the glass substrate, wherein:

the oxide film is formed by adding hydrogen during formation thereof, and then converting said hydrogen into hydrogen radicals; or the oxide film is formed by converting hydrogen into hydrogen radicals, and adding the hydrogen radicals during formation of the oxide film.

According to another aspect of the invention, there is provided a manufacturing method of a semiconductor device having a step of forming an oxide film on a heated glass substrate by plasma CVD or atmospheric pressure CVD by using gases including an organic silane type source gas and oxygen or a source gas including ozone that is generated from oxygen over a gate insulating film in a process of forming a thin-film transistor on the glass substrate, wherein:

the oxide film is formed by adding hydrogen during formation thereof, and then converting said hydrogen into hydrogen radicals; or the oxide film is formed by converting hydrogen into hydrogen radicals, and adding the hydrogen radicals during formation of the oxide film.

According to still another aspect of the invention, there is provided a plasma CVD apparatus for manufacture of a semiconductor device, comprising:

a vacuum chamber;

parallel plate electrodes;

a plasma power source connected to a first one of the electrodes via a matching device;

a substrate holder capable of being heated, for placing a substrate having a film forming surface on a second one of the electrodes; and a pump connected to the vacuum chamber via a flow control valve, wherein an organic silane type source gas and oxygen or oxygen partially converted into ozone are introduced into the vacuum chamber via respective flow rate controllers through the first electrode; and $H_2O$ is introduced into the vacuum chamber together with a carrier gas independently of the organic silane type source gas by bubbling water in a tank with the carrier gas that is supplied via a flow rate controller.

According to another aspect of the invention, there is provided an atmospheric pressure CVD apparatus for manufacture of a semiconductor device, comprising:

a substrate holder capable of being heated, for mounting a substrate having a film forming surface; and a gas nozzle so disposed as to be opposed to the film forming surface of the substrate, wherein an organic silane type source gas and a carrier gas are supplied to the gas nozzle via a flow rate controller;

oxygen is supplied, via a flow rate controller, to an ozonizer for converting part of said oxygen into ozone, and then supplied to the gas nozzle; and hydrogen is supplied, via a flow rate controller, to a catalyst for converting part of said hydrogen into hydrogen radicals, and then supplied to the gas nozzle.

To attain the above objects, according to a further aspect of the invention, there is provided a manufacturing method of a semiconductor device having a step of forming an oxide film on a heated substrate by plasma CVD or atmospheric pressure CVD by using material gases including an organic silane type source gas and hydrogen or active hydrogen, wherein:

the oxide film is formed by adding nitrogen oxide expressed as $N_xO_y$ during formation thereof.

According to another aspect of the invention, there is provided a manufacturing method of a semiconductor device having a step of forming an oxide film on a heated substrate by plasma CVD or atmospheric pressure CVD by using material gases including an organic silane type source gas and $H_2O$, wherein:

the oxide film is formed by adding nitrogen oxide expressed as $N_xO_y$ during formation thereof.

According to another aspect of the invention, there is provided a manufacturing method of a semiconductor device having a step of forming an oxide film on at least part of a hydrophilic surface of a heated substrate by atmospheric pressure CVD by using material gases including an organic silane type source gas, oxygen or a source gas including ozone that is generated from oxygen, and hydrogen or active hydrogen with an ozone density set at more than 1%, wherein:

the oxide film is formed by adding nitrogen oxide expressed as $N_xO_y$ during formation thereof.

According to another aspect of the invention, there is provided a manufacturing method of a semiconductor device having a step of forming an oxide film on a heated substrate by plasma CVD by using material gases including an organic silane type source gas, oxygen or a source gas including ozone that is generated from oxygen, and hydrogen or active hydrogen, wherein:

an amount of said oxygen or the source gas including ozone generated from oxygen is less than 15 times an amount of the organic silane type source gas; and said hydrogen or active hydrogen is added at an amount not less than 0.01 times the amount of the organic silane type source gas; and the oxide film is formed by adding nitrogen oxide expressed as $N_xO_y$ during formation thereof.

According to another aspect of the invention, there is provided a manufacturing method of a semiconductor device having a step of forming an oxide film on a heated substrate by plasma CVD by using material gases including an organic silane type source gas, oxygen or a source gas including ozone that is generated from oxygen, and $H_2O$, wherein:

an amount of said oxygen or the source gas including ozone generated from oxygen is less than 15 times an amount of the organic silane type source gas; and said $H_2O$ is added by bubbling $H_2O$ with a carrier gas of an amount 0.1 to 1 times the amount of the organic silane type source gas during formation of the oxide film; and the oxide film is formed by adding nitrogen oxide expressed as $N_xO_y$ during formation thereof.

According to another aspect of the invention, there is provided a manufacturing method of a semiconductor device having a step of forming an oxide film on a heated substrate by atmospheric pressure CVD by using material gases including an organic silane type source gas and hydrogen or active hydrogen, wherein:

said hydrogen or active hydrogen is added at an amount not less than 0.1 times the amount of the organic silane type source gas; and the oxide film is formed by adding nitrogen oxide expressed as $N_xO_y$ during formation thereof.

According to another aspect of the invention, there is provided a manufacturing method of a semiconductor device having a step of forming an oxide film on a heated glass substrate by plasma CVD or atmospheric pressure CVD by using gases including an organic silane type source gas and hydrogen or active hydrogen under a semiconductor layer to become an active layer in a process of forming a thin-film transistor on the glass substrate, wherein:

the oxide film is formed by adding nitrogen oxide expressed as $N_xO_y$ during formation thereof.

According to another aspect of the invention, there is provided a manufacturing method of a semiconductor device having a step of forming an oxide film on a heated glass substrate by plasma CVD by using gases including an organic silane type source gas and hydrogen or active hydrogen over a semiconductor layer to become an active layer in a process of forming a thin-film transistor on the glass substrate, wherein:

the oxide film is formed by adding nitrogen oxide expressed as $N_xO_y$ during formation thereof.

According to another aspect of the invention, there is provided a manufacturing method of a semiconductor device having a step of forming an oxide film on a heated glass substrate by plasma CVD or atmospheric pressure CVD by using gases including an organic silane type source gas and hydrogen or active hydrogen over a gate insulating film in a process of forming a thin-film transistor on the glass substrate, wherein:

the oxide film is formed by adding nitrogen oxide expressed as $N_xO_y$ during formation thereof.

According to another aspect of the invention, in the above manufacturing methods of a semiconductor device, the organic silane type source gas is one of TEOS, OMCTS, and HMDS.

According to another aspect of the invention, in the above manufacturing methods of a semiconductor device, the organic silane type source gas is a material including fluorine.

According to another aspect of the invention, in the above manufacturing methods of a semiconductor device, the nitrogen oxide expressed as $N_xO_y$ is one selected from the group consisting of $N_2O$, $NO$, $N_2O_3$, $NO_2$, $N_2O_4$, $N_2O_5$, $NO_3$ and $N_2O_6$.

According to another aspect of the invention, in the above manufacturing methods of a semiconductor device, a content of carbon expressed as C of the oxide film as measured by SIMS has a minimum value of less than $3 \times 10^{19}$ cm$^{-3}$ in a depth-direction profile, and a content of nitrogen expressed as N of the oxide film as measured by SIMS has a maximum value of more than $1 \times 10^{19}$ cm$^{-3}$ in a depth-direction profile.

The present assignee previously used a mixture of oxygen and ethyl orthosilicate in forming an oxide film by plasma CVD by using ethyl orthosilicate. As a result of various experiments to find a proper method for reducing the carbon content of a film formed, the inventors have found that it is effective to use hydrogen radicals, hydrogen ions, etc. during the film formation. Active hydrogen such as hydrogen radicals and hydrogen ions gasify carbon by reacting with it and forming $CH_x$. It is possible to eliminate carbon during film formation particularly by cutting carbon single bonds C—C to produce $CH_4$ and C—OH.

Hydrogen has a stronger decarbonization effect than oxygen. Further, since the hydrogen atom is small, the sputtering effect of hydrogen ions on a film and a substrate is almost negligible. Therefore, in forming a film by plasma CVD by mixing an organic silane type source gas, nitrogen oxide, and hydrogen, the mixing ratio of the organic silane type source gas and nitrogen oxide is so determined as to provide a film forming rate that enables superior step coverage and high productivity and hydrogen is mixed for decarbonization. In particular, the above effects are remarkable when hydrogen is introduced by an amount 0.1 to 1 times the amount of the organic silane type source gas. Plasma-generated precursors from the organic silane source gas, oxygen ions, ozone, and oxygen radicals repeat film forming surface reaction on the substrate surface. In this operation, the precursors flow above the substrate surface while transforming into various type of precursors, to form an oxide film having superior step coverage. While the oxide film is formed by reaction among the precursors, oxygen ions, ozone, and oxygen radicals, hydrogen ions and hydrogen radicals gasify carbon by reacting with carbon atoms on the substrate surface. Gasified carbon is exhausted by a vacuum pump.

If it is possible to dope an oxide film with nitrogen at the same time as reduce carbon contained therein, the advantages of both of an oxide film and a nitride film can be obtained. In particular, in forming a nitrogen-doped oxide film by using an organic silane type source gas such as ethyl orthosilicate, both oxygen and nitrogen can be supplied to a film during film formation by using nitrogen oxide ($N_xO_y$, compound of nitrogen and oxygen) such as $N_2O$, $NO$, $N_2O_3$, $NO_2$, $N_2O_4$, $N_2O_5$, $NO_3$ and $N_2O_6$. A nitrogen-doped oxide film is much superior in water resistance and impurity blocking performance to a non-doped oxide film. In particular, alkali metals such as Na and K become operative ions moving through an oxide film, which is a major cause of unstable electrical properties of a semiconductor. A nitrogen-doped oxide film is given much improved blocking performance compared to a non-doped oxide film, and therefore can suppress the operability of alkali metals such as Na and K.

The characteristics of a nitrogen-doped oxide film can be varied by properly selecting the molecular weight of nitrogen oxide in accordance the intended characteristics and adding oxygen when it is insufficient.

Since nitrogen oxide consists of nitrogen and oxygen that are combined in advance, an oxide film formed is easily combined, i.e., doped with nitrogen when nitrogen oxide reacts with an organic silane type source gas. A nitrogen-doped oxide film can be formed by using ammonia or a mixture of nitrogen and oxygen instead of nitrogen oxide. However, since relatively large energy is needed to decompose ammonia, the film forming surface of a substrate may be seriously damaged in a plasma method or the like. Further, since nitrogen is hardly combined with other molecules, it is difficult to control the dope amount. Thus, it is very effective to use nitrogen oxide to dope an oxide film with nitrogen when it is formed by using an organic silane type source gas.

Where the invention is applied to film formation by atmospheric pressure CVD, a catalyst method is used to partly convert hydrogen into hydrogen radicals. Proper examples of the catalyst include 3d-transition metals such as platinum, palladium, reduced nickel, cobalt, titanium, vanadium, and tantalum; compounds of metals such as aluminum, nickel, platinum-silicon, platinum-chlorine, platinum-rhenium, nickel-molybdenum, and cobalt-molybdenum; and mixtures or compounds of any of the above transition metals and alumina or silica gel. In addition, Raney catalysts of cobalt, ruthenium, palladium, nickel, and the like, and mixtures or compounds of any of those Raney catalysts and carbon can be used. These catalysts are used in a granulated, reticular, or powder state. Materials having a low melting point and markedly increasing the initial absorption rate of a reactive substance, and materials containing alkali metals such as sodium which easily vaporize are not suitable for the catalyst. Examples of such unfavorable materials are copper and tungsten. Experiments revealed considerable degradation of the catalyst at a temperature higher than the decomposition temperature of a reactive substance. The amount and the density of the catalyst depend on the effective contact area with a reactive gas, and may be adjusted when necessary. Active hydrogen radicals are generated by passing hydrogen through the catalyst being heated. Active ozone is generated by passing oxygen through an ozonizer.

In forming a $SiO_x$ film by using an atmospheric pressure CVD apparatus in which a substrate is heated, organic silane such as ethyl orthosilicate in a tank is bubbled with a carrier gas such as nitrogen. Oxygen is introduced into the apparatus while being partly converted into ozone in passing through the ozonizer. Hydrogen is introduced into the apparatus through the catalyst.

Where nitrogen oxide is added to a $SiO_x$ film, organic silane in a tank is bubbled with a carrier gas such as a carrier gas of nitrogen oxide ($N_xO_y$) such as $NO$, $NO_2$ or $N_2O$. Oxygen is introduced into the apparatus while being partly converted into ozone in passing through the ozonizer. Hydrogen is introduced into the apparatus through the catalyst.

All gases are supplied to the substrate in a mixed state from a gas nozzle having a dispersing mechanism. In forming a film by atmospheric pressure CVD by using only ethyl orthosilicate and ozone, an oxide film is formed much differently depending on whether the surface of a substrate is hydrophilic or hydrophobic. While a normal film can be formed on a substrate having a hydrophobic surface, abnormal film formation or reduction in film forming rate likely occurs with a hydrophilic surface. There occurs problems when an oxide film is formed on at least part of a hydrophilic surface. In contrast, the invention, which is associated with the use of hydrogen radicals, can not only provide the impurity blocking effect but also prevent abnormal film formation and reduction in film forming rate because active hydrogen terminates the substrate surface to thereby create a hydrophobic surface. In particular, these effects are remarkable when hydrogen is introduced by an amount 0.1 to 1 times the amount of a carrier gas such as nitrogen. Where ethyl orthosilicate is directly gasified by heating it, these effects are enhanced by a factor of 1 to 5.

Where nitrogen oxide is added to a $SiO_x$ film, nitrogen oxide can be used as a carrier gas. Similar effects can be obtained by using, as a carrier gas, nitrogen or the like rather than nitrogen oxide and introducing nitrogen oxide by a separate system.

Although in the above description hydrogen radicals are generated by plasma in plasma CVD and by a catalyst method in atmospheric pressure CVD, they may be generated in opposite manners. That is, active hydrogen radicals may be generated in advance by a catalyst method and then introduced into a plasma CVD apparatus. It is also possible to generate active hydrogen radicals in advance by discharging and then mix those with other gases by a gas nozzle of an atmospheric pressure CVD apparatus.

Where an oxide film is formed by using an organic silane type source gas, an oxygen source gas is used because active oxygen radicals, oxygen ions, and ozone are necessarily used. In the invention, $H_2O$ may be used to additionally use active hydrogen radicals or hydrogen ions. However, since $H_2O$ and an organic silane source gas react with each other very actively, there is a possibility that a pipe may be clogged if they are mixed with each other in the pipe before their reaction on a substrate. It is preferable that in a plasma CVD apparatus the pipes for introducing an organic silane source gas and $H_2O$ are separately provided.

DETAILED DESCRIPTION OF THE PREFERRED EMBODIMENTS

Embodiment 1

Figure 1:
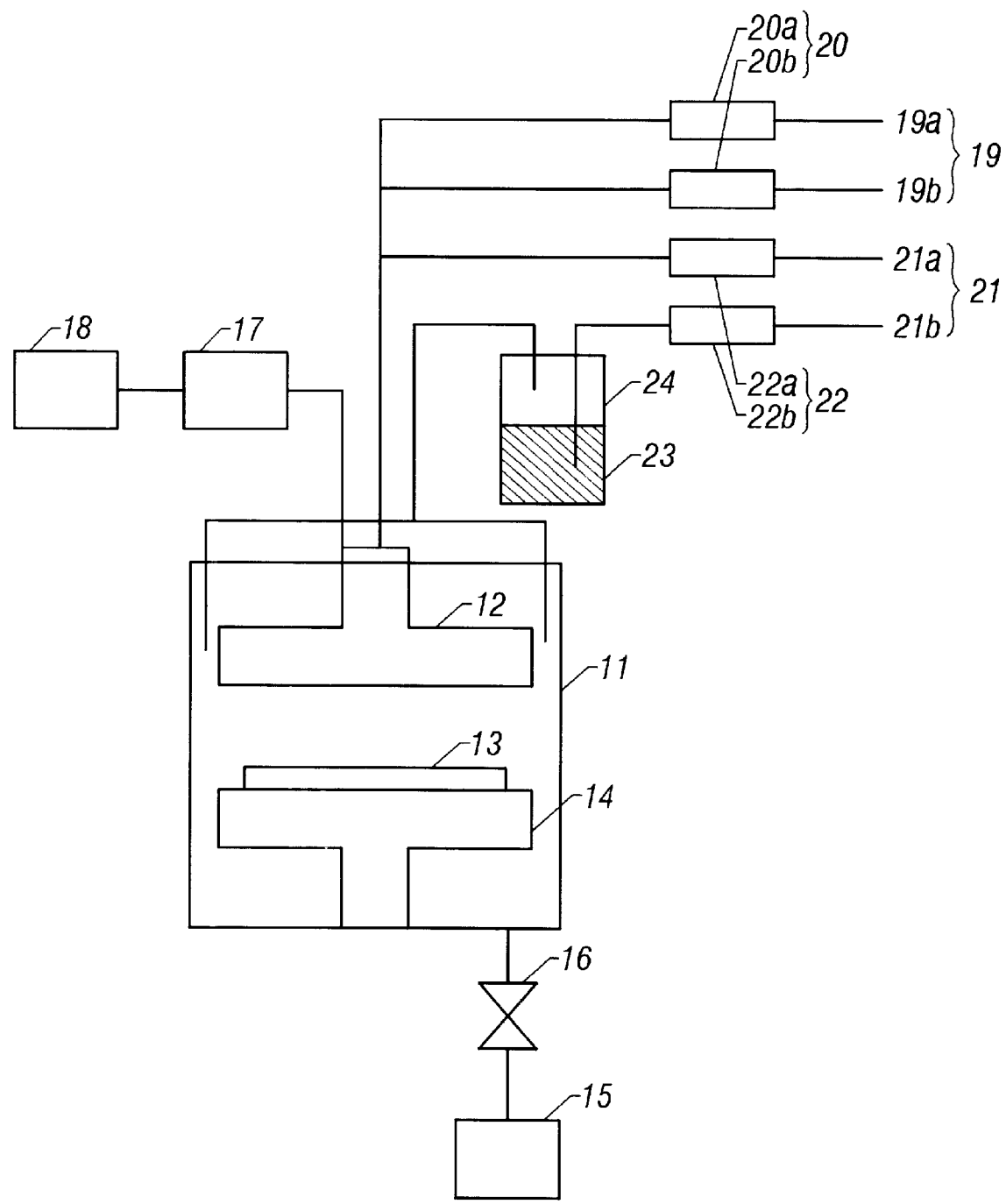
FIG. 1 shows a parallel plate plasma CVD apparatus used in first and second embodiments of the present invention.

FIG. 1 shows a parallel plate plasma CVD apparatus that is used to practice the present invention. A vacuum chamber 11 capable of being evacuated accommodates a cathode 12 that also serves as a gas shower head, a substrate 13 for film formation, and an anode 14 having a role of a substrate holder that incorporates a heater and hence can heat the substrate 13. A pump 15 for evacuating the vacuum chamber 11 and exhausting an unnecessary gas is coupled to the vacuum chamber 11 around the anode 14. A control valve 16 for controlling the pressure of the vacuum chamber 11 approximately at a constant value is provided between the vacuum chamber 11 and the pump 15. A plasma power supply 18 is connected to the cathode 12 via a matching device 17.

In this embodiment, film forming source gases 19 of organic silane 19a and oxygen 19b are supplied to the cathode 12 via flow rate controllers 20, that is, an organic silane flow rate controller 20a and an oxygen flow rate controller 20b. Decarbonization source gases 21 of hydrogen 21a and a decarbonization carrier gas 21b can be introduced into the chamber 11 via decarbonization source gas flow rate controllers 22, that is, a hydrogen flow rate controller 22a and a carrier gas flow rate controller 22b. The decarbonization carrier gas 21b is allowed to bubble $H_2O$ 23 that is contained in a water tank 24. Only this system is separated from the other gas systems and directly connected to the vacuum chamber 11 to prevent the pipe from being clogged due to reaction of ethyl orthosilicate and $H_2O$.

The cathode 12 incorporates an agitation mechanism such as a dispersing plate to allow gases to be applied uniformly onto the surface of the substrate 13. Since organic silane 19a assumes liquid form at the ordinary temperature and in many cases has an insufficient vapor pressure, some measure is needed to prevent organic silane 19a from cohering between its tank and the vacuum chamber 11. For example, organic silane in the tank is bubbled with an inert gas (carrier gas) such as He, Ne or Ar. Alternatively, the tank is heated to increase the vapor pressure of the organic silane source gas and the pipe from the tank to the vacuum chamber 11 is heated to a temperature higher than that of the tank.

After the vacuum chamber 11 was evacuated, the substrate 13 was heated to 200–500° C. by the heater that was incorporated in the anode 14. If the substrate temperature is too low, the density of a resulting film becomes so low as to be almost unusable as a film for a semiconductor. Typically, the substrate temperature was set at 300–350° C. Ethyl orthosilicate was used as organic silane 19a. In a state that the tank of ethyl orthosilicate was heated to 80° C. and the entire pipe from the tank to the vacuum chamber 11 was heated to 90° C., ethyl orthosilicate was introduced into the vacuum chamber 11 while its flow rate was controlled by the organic silane flow rate controller 20a. Hydrogen 21a was used as the decarbonization source gas 21.

The power supplied from the plasma power supply 18 was 0.1–1.5 W/cm$^2$, typically 0.2–0.5 W/cm$^2$. The reaction pressure was set at 0.1–3 Torr, typically 0.8–1.5 Torr. The gases were supplied at a ratio (ethyl orthosilicate):oxygen:hydrogen=1:1–15:0–10. The interval between the cathode 12 and the anode 13 was set at 30–150 mm, typically 70 mm.

Further, without using any decarbonization source gas 21, oxide films were formed with supply ratios (ethyl orthosilicate):oxygen=1:1, 1:3, 1:5, 1:10 and 1:15. The other conditions were such that the substrate temperature was 300–350° C., the supply power was 0.2–0.5 W/cm$^2$, the electrode interval was 70 mm, and the reaction pressure was 0.8–1.5 Torr. Table 1 shows results of the step coverage, the carbon content, and the hygroscopicity of the respective cases.

TABLE 1

| Gas supply ratio | 1:1 | 1:3 | 1:5 | 1:10 | 1:15 |
|---|---|---|---|---|---|
| Step coverage | 1.0 | 1.0 | 0.8 | 0.6 | 0.2 |
| Carbon content ($cm^{-3}$) | $6 \times 10^{21}$ | $7 \times 10^{20}$ | $6 \times 10^{19}$ | $1 \times 10^{19}$ | $7 \times 10^{18}$ |
| Hygroscopicity ratio | 10 | 7 | 1 | 0.1 | 0 |

Figure 2:
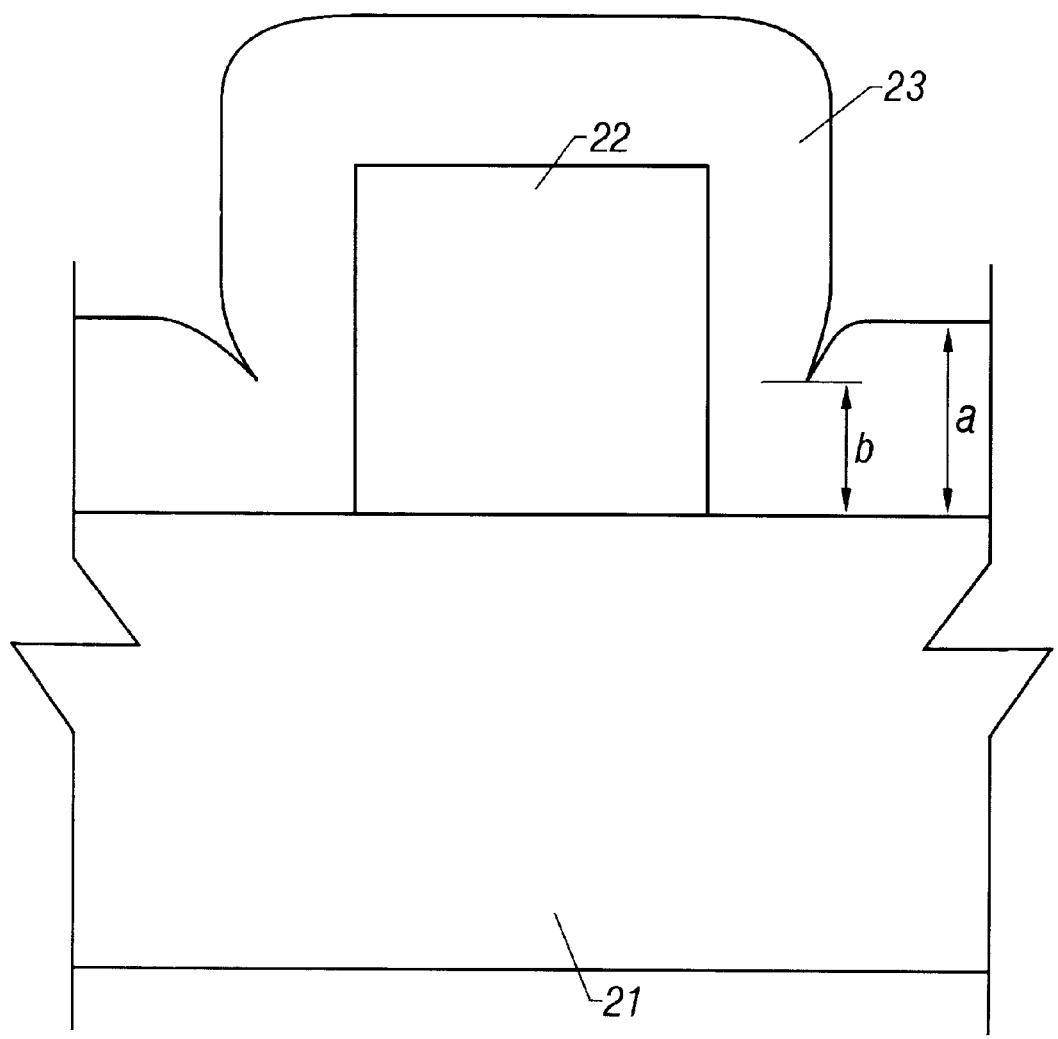
FIG. 2 illustrates a method of evaluating the step coverage.

Referring to FIG. 2, the step coverage is defined by b/a. In FIG. 2, a step pattern 25 formed on a substrate 13 is covered with an oxide film 26. The step pattern 25 was formed by depositing aluminum at a thickness of 1 μm and then patterning it into lines having a width of 1 μm. Symbol b means a minimum thickness of the oxide film 26 adjacent to the side face of the step pattern 25, and a means a thickness of the oxide film 26 at a position sufficiently distant (about 3 μm in measurements) from the step pattern 25. The carbon content is defined as a minimum of carbon concentration values in terms of the number of carbon atoms per cubic centimeters as measured in the depth direction of the oxide film 26 to the substrate surface by secondary ion mass spectrometry. The hygroscopicity ratio is defined such that an increase from the initial value of a peak absorption value in the vicinity of 3,660 $cm^{-1}$ when an oxide film is left for 12 hours in an atmosphere of 25° C. and humidity of 60%RH is divided by a film thickness in nm and then multiplied by a certain constant (normalized). Although the above definition of the hygroscopicity ratio is not a universal one, it enables comparison among samples.

As clearly seen from Table 1, as the ratio of oxygen to ethyl orthosilicate is increased, the step coverage degrades, the carbon content decreases, and the hygroscopicity lowers.

Table 2 shows results of an experiment in which the supply ratio of hydrogen to ethyl orthosilicate ratio was set at 0.01, 0.05, 0.1, 0.2, 0.5 and 0.8.

TABLE 2

| Hydrogen ratio | | 0.01 | 0.05 | 0.1 | 0.2 | 0.5 | 0.8 |
|---|---|---|---|---|---|---|---|
| 1:1 | Step coverage | 1 | 1 | 1 | 1 | 1 | 1 |
| | Carbon content ($cm^{-3}$) | $2 \times 10^{21}$ | $8 \times 10^{20}$ | $1 \times 10^{20}$ | $8 \times 10^{19}$ | $6 \times 10^{19}$ | $6 \times 10^{19}$ |
| | Hygroscopicity ratio | 10 | 5 | 2.5 | 1.4 | 1 | 1 |
| 1:3 | Step coverage | 1 | 1 | 1 | 1 | 1 | 1 |
| | Carbon content ($cm^{-3}$) | $7 \times 10^{20}$ | $4 \times 10^{20}$ | $7 \times 10^{19}$ | $4 \times 10^{19}$ | $2 \times 10^{19}$ | $2 \times 10^{19}$ |
| | Hygroscopicity ratio | 7 | 4.5 | 2 | 1 | 0.7 | 0.7 |
| 1:5 | Step coverage | 0.8 | 0.8 | 0.8 | 0.8 | 0.8 | 0.8 |
| | Carbon content ($cm^{-3}$) | $4 \times 10^{19}$ | $2 \times 10^{19}$ | $1 \times 10^{19}$ | $8 \times 10^{18}$ | $6 \times 10^{18}$ | $6 \times 10^{18}$ |
| | Hygroscopicity ratio | 0.9 | 0.6 | 0.3 | 0.2 | 0.1 | 0.1 |
| 1:10 | Step coverage | 0.6 | 0.6 | 0.6 | 0.6 | 0.6 | 0.6 |
| | Carbon content ($cm^{-3}$) | $1 \times 10^{19}$ | $8 \times 10^{18}$ | $7 \times 10^{18}$ | $6 \times 10^{18}$ | $5 \times 10^{18}$ | $5 \times 10^{18}$ |
| | Hygroscopicity ratio | 0.1 | 0.08 | 0.04 | 0 | 0 | 0 |
| 1:15 | Step coverage | 0.2 | 0.2 | 0.2 | 0.2 | 0.2 | 0.2 |
| | Carbon content ($cm^{-3}$) | $7 \times 10^{18}$ | $6 \times 10^{18}$ | $6 \times 10^{18}$ | $5 \times 10^{18}$ | $4 \times 10^{18}$ | $4 \times 10^{18}$ |
| | Hygroscopicity ratio | 0 | 0 | 0 | 0 | 0 | 0 |

While the addition of hydrogen of only 0.01 affects all the characteristics concerned, the addition of hydrogen exceeding 0.5 does not change the characteristics. In particular, the addition of hydrogen can reduce the carbon content and improve the hygroscopicity while causing almost no change in step coverage. Further, it is understood that where oxygen is introduced by an amount 15 times that of ethyl orthosilicate, the addition of hydrogen has almost no effects. Therefore, it is concluded that the invention becomes effective when the supply ratio of oxygen to ethyl orthosilicate is less than 15 and the supply ratio of hydrogen to ethyl orthosilicate is not less than 0.01.

Similar results were obtained by introducing $H_2O$ instead of hydrogen. By setting the supply ratio of oxygen to ethyl orthosilicate less than 15 and setting the supply ratio of a carrier gas for bubbling $H_2O$ to ethyl orthosilicate in a range of 0.1 to 1, the carbon content was reduced and the hygroscopicity was improved without causing almost no change in step coverage. However, in the case of adding $H_2O$ which also contains oxygen, excessive addition thereof changes the step coverage unlike the case of adding hydrogen. Therefore, there is a certain upper limit in the amount of added $H_2O$.

Embodiment 2

This embodiment is directed to a case of adding $N_xO_y$ while forming an oxide film by using the parallel plate plasma CVD apparatus, which was also used in the first embodiment. In this embodiment, as for film forming source gases 19, ethyl orthosilicate is used as an organic silane type source gas 19a and $N_2O$ 19b is also used. The film forming source gases 19a and 19b are supplied to a cathode 12 via film forming flow rate controllers 20, that is, an ethyl orthosilicate flow rate controller 20a and an $N_2O$ flow rate controller 20b. The components given the other reference symbols are the same as the corresponding components in the first embodiment.

As described in the first embodiment, since organic silane 19a assumes liquid form at the ordinary temperature and in many cases has an insufficient vapor pressure, some measure is needed to prevent organic silane 19a from cohering between its tank and the vacuum chamber 11. Where nitrogen oxide is added as in this embodiment, one method is to bubble organic silane in the tank with an inert gas (carrier gas) such as He, Ne or Ar. Alternatively, nitrogen oxide may be bubbled to have it serve both as a carrier gas and as a source gas of nitrogen and oxygen.

Film formation was performed in the following manner. After the vacuum chamber 11 was evacuated, the substrate 13 was heated to 200–500° C. by the heater that was incorporated in the anode 14. If the substrate temperature is too low, the density of a resulting film becomes so low as to be almost unusable as a film for a semiconductor. Typically, the substrate temperature was set at 300–350° C. In a state that the tank of ethyl orthosilicate was heated to 80° C. and the entire pipe from the tank to the vacuum chamber 11 was heated to 90° C., ethyl orthosilicate was introduced into the vacuum chamber 11 while its flow rate was controlled by the ethyl orthosilicate flow rate controller 20a. Hydrogen 21a was used as the decarbonization source gas 21.

The power supplied from the plasma power supply 18 was 0.1–1.5 W/cm$^2$, typically 0.2–0.5 W/cm$^2$. The reaction pressure was set at 0.1–3 Torr, typically 0.8–1.5 Torr. The gases were supplied at a ratio (ethyl orthosilicate):$N_2O$:hydrogen= 1:115:0–1. The interval between the cathode 12 and the anode 13 was set at 30–150 mm, typically 70 mm.

While the addition of hydrogen of only 0.01 affects all the characteristics concerned, the addition of hydrogen exceeding 0.5 does not change the characteristics. In particular, the addition of hydrogen can reduce the carbon content and improve the hygroscopicity while causing almost no change in step coverage. Further, it is understood that where $N_2O$ is introduced by an amount 15 times that of ethyl orthosilicate, the addition of hydrogen has almost no effects. Therefore, it is concluded that the invention becomes effective when the supply ratio of $N_2O$ to ethyl orthosilicate is less than 15 and the supply ratio of hydrogen to ethyl orthosilicate is not less than 0.01. Almost the same effects were obtained when NO, $NO_2$, or the like was used instead of $N_2O$.

Figure 3A:
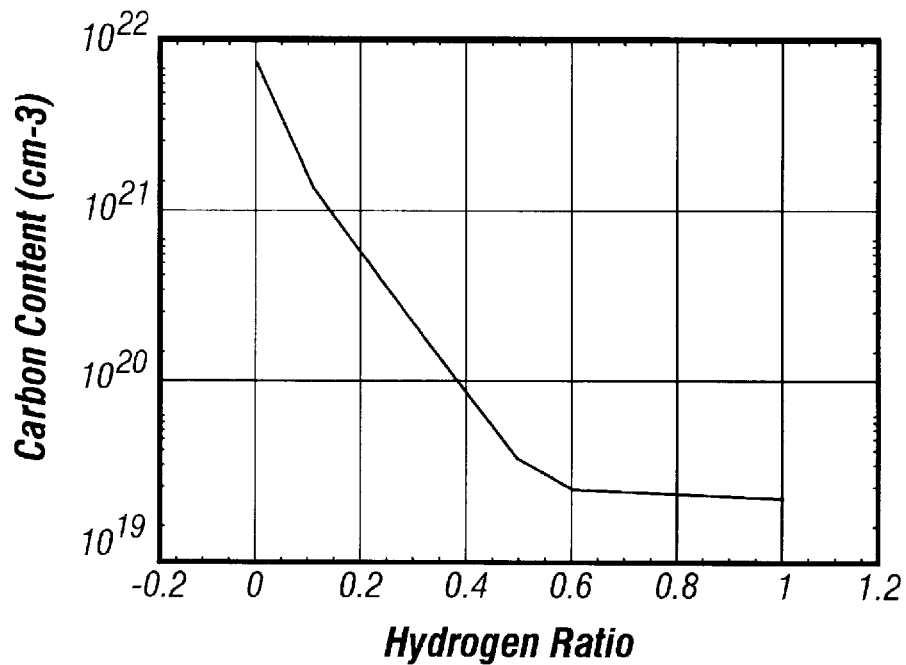
FIGS. 3A and 3B show measurement data of oxide films formed according to the invention.
Figure 3B:
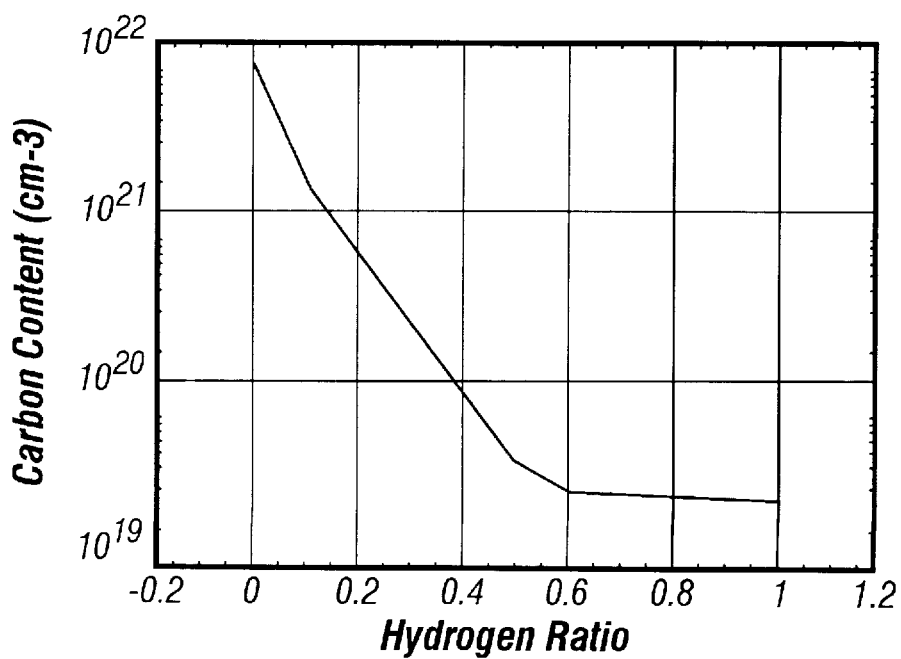

FIGS. 3A and 3B are data of various characteristics showing the effects of hydrogen and $N_2O$. FIG. 3A shows the carbon content that was obtained when the supply ratio of ethyl orthosilicate to $N_2O$ was fixed at 1:5 and the added amount of hydrogen was varied. The vertical axis represents the carbon content as defined by the minimum carbon content in an oxide film in a depth-direction profile obtained by SIMS (secondary ion mass spectrometry). The horizontal axis the supply ratio of hydrogen to ethyl orthosilicate. It is seen that the carbon content in an oxide film can be reduced by slightly adding hydrogen, and that the carbon content approximately saturates with respect to the hydrogen ratio in the hydrogen ratio range larger than 0.5. When the hydrogen ratio is 0.5, a minimum content of carbon in the depth-direction profile is about $3 \times 10^{19}$ cm$^{-3}$. The minimum carbon content is smaller than this value when the hydrogen ratio is larger than 0.5, and is larger than this value when the hydrogen ratio is smaller than 0.5. Although the added amount of hydrogen varies with process conditions, the above value of carbon content serve as one measure.

FIG. 3B shows results of what is called BT tests (measurements of movement of operative ion charges by means of a MOS capacitor) performed in a case where the supply ratio of ethyl orthosilicate to hydrogen was fixed at 1:0.5 and the added amount of $N_2O$ was varied, and in a case where oxygen was used instead of $N_2O$. A 1,000-Å-thick oxide film was formed on a substrate of a P-type silicon wafer by using $N_2O$ or oxygen, and a MOS capacitor was formed by depositing aluminum on the oxide film and the back surface of the substrate by evaporation. In this evaporating operation, electrodes containing alkali metals were intentionally formed by depositing aluminum by resistance heating by means of a tungsten coil. Annealing was performed at 120° C. for 30 minutes in a nitrogen atmosphere while a voltage was applied to the top electrode of the MOS capacitor to produce 1 MV/cm. After the temperature was reduced to the room temperature, the capacitance of the MOS capacitor was measured at low and high frequencies and a flat-band voltage ($+V_{FB}$) was calculated. Then, annealing was again performed at 120° C. for 30 minutes in a nitrogen atmosphere while −1 MV/cm was applied. After the temperature was reduced to the room temperature, the capacitance of the MOS capacitor was measured at low and high frequencies and a flat-band voltage ($-V_{FB}$) was calculated. The absolute value of a difference between $+V_{FB}$ and $-V_{FB}$ is denoted by $\Delta V_{FB}$ and used as the vertical axis of FIG. 3B.

The horizontal axis represents the ratio of $N_2O$ or oxygen to ethyl orthosilicate.

In the case of using oxygen instead of $N_2O$, $\Delta V_{FB}$ is large over the entire range of the added amount of oxygen except for a slight decrease in a range where the oxygen amount is small. On the other hand, in the case of using $N_2O$, $\Delta V_{FB}$ decreases as the added amount of $N_2O$ increases, and saturates when the ratio of $N_2O$ to ethyl orthosilicate is larger than 5. When $\Delta V_{FB}$ is large, alkali metals in the oxide film are moved by an electric field applied thereto. It is seen that the use of $N_2O$ has a remarkable effect. It has been found that the step coverage is degraded when the supply ratio of $N_2O$ to ethyl orthosilicate is larger than 15. Nitrogen contents were measured by SIMS in a case where $N_2O$ was supplied by an amount 5 times that of ethyl orthosilicate, to find that the maximum content of nitrogen (N) in the depth direction was about $1 \times 10^{19}$ cm$^{-3}$. It was also confirmed that the maximum content was smaller than the above value when the $N_2O$ ratio is smaller than 5, and was larger than the above value when the $N_2O$ content is larger than 5. Although the mixing ratio varies with parameters X and Y in a molecular formula $N_xO_y$ of nitrogen oxide, in terms of characteristics the maximum nitrogen (N) content value of about $1\times10^{19}$ cm$^{-3}$ in the depth direction serves as one measure.

Similar results were obtained by introducing $H_2O$ instead of hydrogen. By setting the supply ratio of $N_2O$ to ethyl orthosilicate less than 15 and setting the supply ratio of a carrier gas for bubbling $H_2O$ to ethyl orthosilicate in a range of 0.1 to 1, the carbon content was reduced and the hygroscopicity was improved without causing almost no change in step coverage. However, in the case of adding $H_2O$ which also contains oxygen, excessive addition thereof changes the step coverage unlike the case of adding hydrogen. Therefore, there is a certain upper limit in the amount of added $H_2O$; the step coverage is degraded if the ratio of the carrier gas to ethyl orthosilicate is larger than unity.

Embodiment 3

Figure 4:
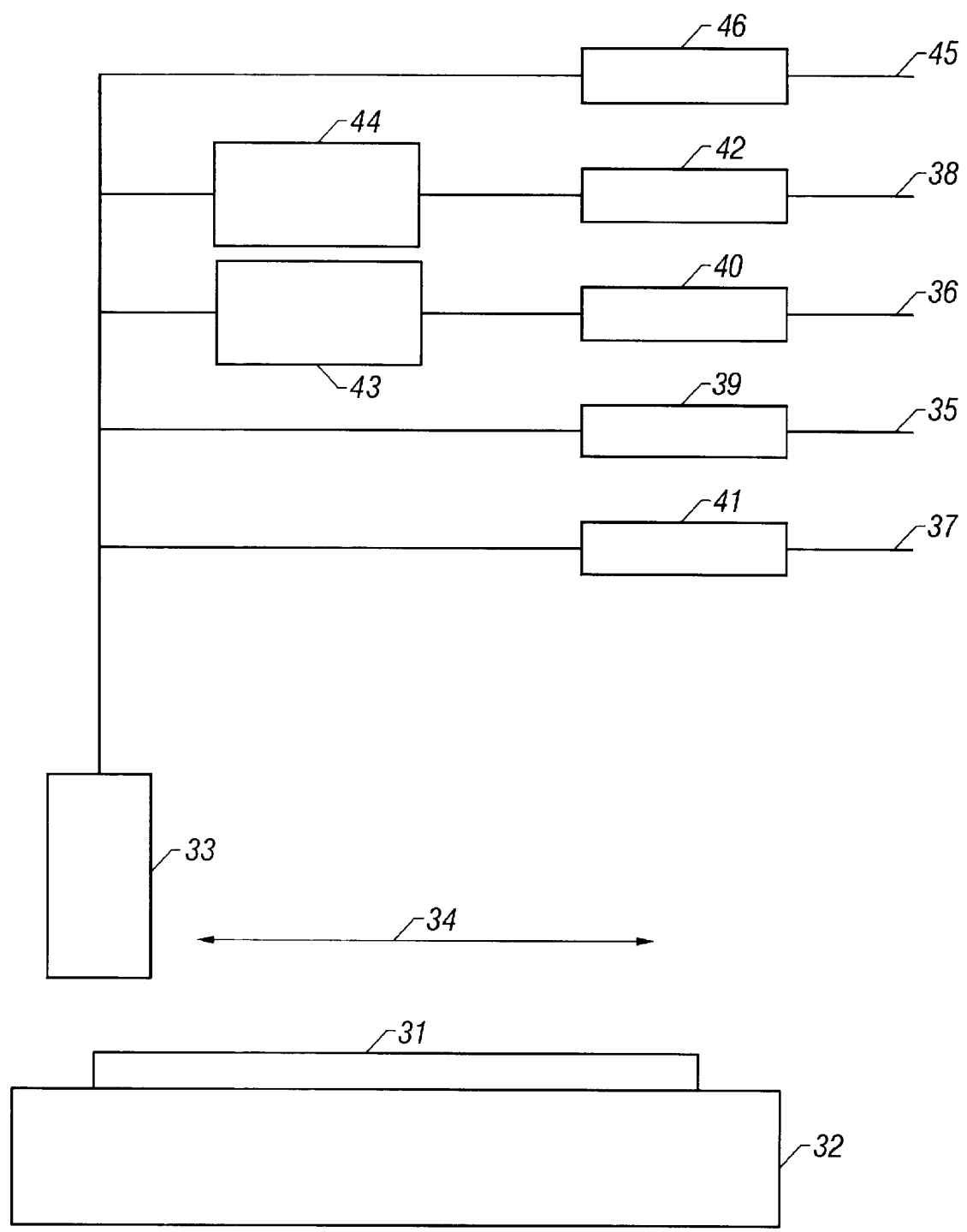
FIG. 4 shows an atmospheric pressure CVD apparatus used in third and fourth embodiments of the invention.

This embodiment is directed to a case of forming an oxide film by using an atmospheric pressure CVD apparatus shown in FIG. 4.

A substrate 31 is placed on a substrate holder 32 incorporating a heater. In this embodiment, a gas nozzle 33 incorporating a gas dispersing system is so constructed as to be capable of reciprocal movement (indicated by arrow 34) above the substrate 31. The gas nozzle 33 need not always be provided with a mechanism of allowing film formation with its reciprocal movement as in this embodiment, but may be fixed in a state of allowing uniform gas supply over the entire surface of the substrate 31. As a further alternative, the apparatus may be constructed such that the gas nozzle 33 is fixed while the substrate holer 32 is moved. Further, although in this embodiment the substrate 31 is located under the gas nozzle 33 and the film-forming surface is directed upward (face-up arrangement), the substrate 31 may be located above the gas nozzle 33 so that the film-forming surface is directed downward (face-down arrangement), in which case the gas nozzle 33 supplies gases to the substrate 31 from below.

As for the gas system, an organic silane type source gas 35 is supplied to the gas nozzle 33 via an organic silane type gas flow rate controller 39. Oxygen 36 is supplied to ozonizer 43 via an oxygen flow rate controller 40, and then supplied to the gas nozzle 33. Hydrogen 38 is supplied to a catalyst 44 via a hydrogen flow rate controller 42. Further, a nitrogen oxide source gas 45 (used in the fourth embodiment) is supplied to the gas nozzle 33 via a nitrogen oxide flow rate controller 46.

The ozonizer 44 effectively generates ozone from oxygen. A carrier gas 37 is supplied to the gas nozzle 33 via a carrier gas flow rate controller 41. In this system, the vapor pressure of an organic silane type gas is increased by heating a tank containing it, and is directly controlled by the organic silane type gas flow rate controller 39. Alternatively, it is also effective to bubble an organic silane type material in a tank with a gas such as nitrogen or helium and use a resulting gas as the organic silane type source gas 35.

Proper examples of the catalyst 44 include 3d-transition metals such as platinum, palladium, reduced nickel, cobalt, titanium, vanadium, and tantalum; compounds of metals such as aluminum, nickel, platinum-silicon, platinum-chlorine, platinum-rhenium, nickel-molybdenum, and cobalt-molybdenum; and mixtures or compounds of any of the above transition metals and alumina or silica gel. In addition, Raney catalysts of cobalt, ruthenium, palladium, nickel, and the like, and mixtures or compounds of any of those Raney catalysts and carbon can be used. These catalysts are used in a granulated, reticular, or powder state. Materials having a low melting point and markedly increasing the initial absorption rate of a reactive substance, and materials containing alkali metals such as sodium which easily vaporize are not suitable for the catalyst 44. Examples of such unfavorable materials are copper and tungsten.

Experiments revealed considerable degradation of the catalyst 44 at a temperature higher than the decomposition temperature of a reactive substance.

The amount and the density of the catalyst 44 depend on the effective contact area with a reactive gas, and may be adjusted when necessary. When hydrogen is passed through the catalyst 44 being heated, hydrogen is partly converted into active hydrogen radicals. In this embodiment, the catalyst 44 was formed such that platinum (15 wt %) was mixed into alumina and a mixture was granulated.

The substrate 31 was heated to 300–500° C., typically 300–400° C. Ethyl orthosilicate, OMCTS (octamethylcyclotetrasiloxane), HMDS (hexamethyldisiloxane), and the like were used as the organic silane source gas 35. Typically, ethyl orthosilicate was used. Helium, nitrogen, and the like were used as the carrier gas 37. Typically, helium was used. Table 3 shows results of the step coverage, the carbon content, and the hygroscopicity of respective cases where the ratio of the flow rate of hydrogen 38 to that of the organic silane source gas 35 were set at 0, 0.1, 0.2, 0.5 and 1.

TABLE 3

| | | | | | |
|---|---|---|---|---|---|
| Hydrogen ratio | 0 | 0.1 | 0.2 | 0.5 | 1 |
| Step coverage | 1 | 1 | 1 | 1 | 1 |
| Carbon content (cm$^{-3}$) | $4 \times 10^{21}$ | $1 \times 10^{21}$ | $4 \times 10^{20}$ | $8 \times 10^{19}$ | $8 \times 10^{19}$ |
| Hygroscopicity ratio | 8.0 | 7.5 | 6.0 | 5.0 | 4.9 |

Referring to FIG. 2, the step coverage is defined by b/a. In FIG. 2, a step pattern 25 formed on a substrate 13 is covered with an oxide film 26. The step pattern 25 was formed by depositing aluminum at a thickness of 1 μm and then patterning it into lines having a width of 1 μm. Symbol b means a minimum thickness of the oxide film 26 adjacent to the side face of the step pattern 25, and a means the thickness of the oxide film 26 at a position sufficiently distant (about 3 μm in measurements) from the step pattern 25. The carbon content is defined as a minimum of carbon concentration values in terms of the number of carbon atoms per cubic centimeters as measured in the depth direction of the oxide film 26 to the substrate surface by secondary ion mass spectrometry. The hygroscopicity ratio is defined such that an increase from the initial value of a peak absorption value in the vicinity of 3,660 cm$^{-1}$ when an oxide film is left for 12 hours in an atmosphere of 25° C. and humidity of 60%RH is divided by a film thickness in nm and then multiplied by a certain constant (normalized). Although the above definition of the hygroscopicity ratio is not a universal one, it enables comparison among samples.

Table 3 clearly shows effects of hydrogen radicals generated from hydrogen 38 that was mixed through the catalyst 44. The carbon content is reduced and the hygroscopicity is improved as the mixed amount of hydrogen 38 with respect to the amount of the organic silane source gas 35 is increased to 0.5. It is concluded from these results that the effects of hydrogen radicals are remarkable when the ratio of hydrogen 38 to the organic silane source gas 35 is in a range of 0.1–0.5, and that they saturate even if hydrogen 38 is mixed at a ratio larger than 0.5 though they do not degrade. That is, the carbon content can be reduced by adding hydrogen radicals generated by a catalyst method to the organic silane/ozone type film formation according to atmospheric pressure CVD.

Embodiment 4

This embodiment is directed to a case of forming an oxide film while adding nitrogen oxide by using the atmospheric pressure CVD apparatus shown in FIG. 4.

The substrate 31 was heated to 300–500° C., typically 300–400° C. Ethyl orthosilicate, OMCTS (octamethylcyclotetrasiloxane), HMDS (hexamethyldisiloxane), and the like were used as the organic silane source gas 35. Typically, HMDS was used. Helium, nitrogen, and the like were used as the carrier gas 37. Typically, helium was used.

In this embodiment, the vapor pressure of HMDS is increased by heating a tank containing it, and is directly controlled by the HMDS flow rate controller 39. Alternatively, it is effective to bubble HMDS in a tank with a gas such as nitrogen or helium and use a resulting gas as HMDS 35. It is also effective to bubble HMDS with $NO_2$.

Further, $N_xO_y$ is added to an oxide film by introducing $NO_2$ as nitrogen oxide 45.

The other components given the same reference numerals as the corresponding components in the third embodiment have the same configurations and functions as the latter.

A completed oxide film doped with nitrogen exhibited stable electrical characteristics as, for instance, a capacitor when a minimum value in a depth-direction profile of the carbon concentration in the film as measured by SIMS (secondary ion mass spectrometry) was less than about $3 \times 10^{19}$ cm$^{-3}$. The nitrogen concentration to establish such a condition was attained by adding $NO_2$ by an amount more than 0.1 times the amount of HMDS. A completed oxide film doped with nitrogen exhibited an alkali metal blocking effect when a maximum value in a depth-direction profile of the carbon concentration in the film as measured by SIMS (secondary ion mass spectrometry) was more than about $1 \times 10^{19}$ cm$^{-3}$. The nitrogen concentration to establish such a condition was attained by adding $NO_2$ by an amount more than 5 times the amount of HMDS.

Embodiment 5

This embodiment is directed to a case of applying this invention to formation of a thin-film transistor (hereinafter also called TFT) by using polysilicon.

FIGS. 5A–5F show a manufacturing process of a TFT.

Figure 5A:
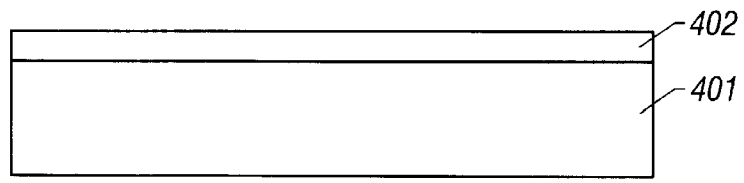
FIGS. 5A–5F shows a TFT manufacturing process according to fifth and sixth embodiments of the invention.

FIG. 5A shows a step of forming an undercoat film 402 on a glass substrate 401. The glass substrate 401 was of a type made of a material that is highly transparent with respect to visible light, such as borosilicate glass or quartz. In this embodiment, Corning 7059 glass produced by Corning Glass Works was used.

The invention was used in forming the undercoat film 402. If the channel is of an N-type, electrons flow through it as carriers. If the channel is of a P-type, holes flow through it as carriers. After completion of a TFT, there may occur an event that as the gate voltage is increased in the on-direction, a region like a channel of an opposite type is formed under the true channel, i.e., on the side of the substrate 401.

If the channel is in an on state, the drain current should saturate with an increase of the gate voltage. However, at a time point when a channel of an opposite type occurs under the true channel, i.e., on the side of the substrate 401, the drain current abruptly increases to form a step in the gate voltage vs. drain current characteristic (what is called a kink effect). The kink effect can be prevented or reduced in possibility by applying the invention in forming the undercoat film 402. The possibility of occurrence of the kink effect is low if the undercoat film 402 is a $SiO_x$ film that is free of impurities.

The undercoat film 402 was formed by using a parallel plate plasma CVD apparatus and gases of ethyl orthosilicate (also called TEOS), oxygen and hydrogen. Other types of organic silane such as OMCTS (octamethylcyclotetrasiloxane) and HMDS (hexamethyldisiloxane) may be used effectively instead of ethyl orthosilicate. The substrate temperature was increased to 200–500° C., typically 400° C., and the film forming pressure was set at 0.1–2 Torr, typically 1 Torr. The frequency of a plasma power supply was made a high frequency of 5–50 MHz, typically 20 MHz, and its power was set at 0.1–2 W/cm$^2$, typically 0.3 W/cm$^2$. The supply ratio of ethyl orthosilicate to oxygen was set at 1:5–20, typically 1:5. The amount of hydrogen was set in a range of (ethyl orthosilicate):hydrogen=1:0.01–1, typically at 1:0.5. The undercoat film 402 was formed at a thickness of 500–3,000 Å, typically 2,000 Å.

In forming an oxide film such as the undercoat film 402 by using organic silane, it is very effective to eliminate carbon from the film by means of hydrogen radicals and hydrogen ions in any plasma CVD method including the parallel plate plasma CVD method.

In the case of forming the undercoat film 402 by atmospheric pressure CVD, it is also possible to eliminate carbon during the film formation by generating hydrogen radicals by a catalyst method and using those during the film formation. Thus, the invention can effectively be applied to atmospheric pressure CVD using organic silane.

In the case of applying the invention to film formation by atmospheric pressure CVD, a catalyst method is used to convert hydrogen to hydrogen radicals. Proper examples of the catalyst include 3d-transition metals such as platinum, palladium, reduced nickel, cobalt, titanium, vanadium, and tantalum; compounds of metals such as aluminum, nickel, platinum-silicon, platinum-chlorine, platinum-rhenium, nickel-molybdenum, and cobalt-molybdenum; and mixtures or compounds of any of the above transition metals and alumina or silica gel. In addition, Raney catalysts of cobalt, ruthenium, palladium, nickel, and the like, and mixtures or compounds of any of those Raney catalysts and carbon can be used. These catalysts are used in a granulated, reticular, or powder state. Materials having a low melting point and markedly increasing the initial absorption rate of a reactive substance, and materials containing alkali metals such as sodium which easily vaporize are not suitable for the catalyst 44. Examples of such unfavorable materials are copper and tungsten.

Experiments revealed considerable degradation of a catalyst at a temperature higher than the decomposition temperature of a reactive substance.

The amount and the density of a catalyst depend on the effective contact area with a reactive gas, and may be adjusted when necessary.

Active hydrogen radicals are generated by passing hydrogen through a catalyst being heated. Active ozone is generated by passing oxygen through an ozonizer.

The substrate 401 is heated in an atmospheric pressure CVD apparatus. Ethyl orthosilicate is introduced into the apparatus by bubbling it contained in a tank with a carrier gas such as nitrogen. Oxygen is introduced into the apparatus through the ozonizer. Hydrogen is introduced into the apparatus through the catalyst. All of those gases are supplied to the substrate 401 in a mixed state from a gas nozzle having a dispersing mechanism.

In forming a film by atmospheric pressure CVD by using only ethyl orthosilicate and ozone, an oxide film is formed much differently depending on whether the surface of a substrate is hydrophilic or hydrophobic. While a clean film can be formed on a substrate having a hydrophobic surface, abnormal film formation or reduction in film forming rate likely occurs with a hydrophilic surface.

The invention, which is associated with the use of hydrogen radicals, can not only provide the decarbonization effect but also prevent abnormal film formation and reduction in film forming rate because active hydrogen terminates the substrate surface to thereby create a hydrophobic surface. In particular, these effects are remarkable when hydrogen is introduced by an amount 0.01 to 1 times the amount of the $N_2$ carrier gas. Where ethyl orthosilicate is directly gasified by heating it, these effects are enhanced when hydrogen is introduced by an amount 0.1 to 1 times the amount of the ethyl orthosilicate.

Figure 5B:
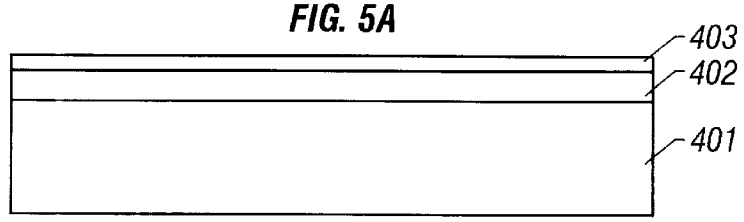

FIG. 5B shows a state that amorphous silicon was formed as an active layer 403 on the undercoat film 402 that was formed on the substrate 401.

The amorphous silicon film was formed at a thickness of 50–3,000 Å, typically 400–1,000 Å, by plasma CVD, low-pressure thermal CVD, sputtering, or the like. In this embodiment, the amorphous silicon film was formed by plasma CVD by decomposing silane with the substrate temperature set at 200–400° C, typically 250–350° C.

Thereafter, the amorphous silicon film was polycrystallized (i.e., converted into a polysilicon film) by causing it to undergo what is called solid-phase growth. This is done at a temperature lower than 600° C. by using the inventions described in Japanese Unexamined Patent Publication Nos. Hei. 6-232059, Hei. 6-244103, and Hei. 6-244104 of the present assignee. Unless hydrogen is removed from the amorphous silicon film to some extent before the solid-phase growth, heating for the solid-phase growth may cause abrupt release of hydrogen from the amorphous silicon film, forming holes in the worst case. Therefore, it is effective to add, before the solid-phase growth, a hydrogen removal step that is performed at 400–500° C. (typically 400° C.) for 0.5–5 hours (typically 1–2 hours) in a nitrogen atmosphere.

The solid-phase growth is associated with what is called a shrinkage problem (contraction of the substrate 401) except for a case where the substrate 401 has a high strain temperature as in the case of quartz. The shrinkage problem can be avoided to some extent by establishing a high initial temperature in advance and performing a subsequent process at a temperature lower than the initial temperature. That is, in doing the solid-phase growth, it is also necessary to take a certain measure against the shrinkage problem.

By using the inventions described in the above-mentioned three publications, the solid-phase growth can be effected at a temperature lower than 600° C, for instance, 500° C. Without the use of this method, the solid-phase growth takes about 4–24 hours at 600° C.

The solid-phase growth converts amorphous silicon into polysilicon in the active layer 403. Where the polysilicon active layer 403 contains a small amount of amorphous components, it is effective to crystallize the amorphous components by applying laser light to the active layer 403.

It is also effective to convert amorphous silicon into polysilicon in the active layer 403 by illuminating it with laser light after the hydrogen removal step instead of performing the solid-phase growth by heating. As for the laser-related conditions, examples of the laser light source are excimer lasers of ArF, ArCl, KrF, KrCl, XeF, XeCl, etc. The laser light energy (density) is 400–1,000 mJ at the exit of the laser main body, and 150–500 $mJ/cm^2$ on the surface of the substrate 401 (shaped by an optical system). These energy (density) values are ones per shot of laser light. The substrate temperature is the room temperature to 300° C. The repetition frequency of illumination is 20–100 Hz. The movement speed of a laser beam relatively to the substrate 401 is 1–5 mm/sec in which a laser beam is moved to scan the substrate 401 or a stage mounted with the substrate 401 is moved. In this embodiment, a KrF excimer laser was used and the laser light energy density was set at 550–650 mJ at the exit of the laser main body and at 180–230 $mJ/cm^2$ on the substrate 401. The repetition frequency of illumination was set at 35–45 Hz. A stage mounted with the substrate 401 was moved at 2.0–3.0 mm/sec.

Figure 5C:
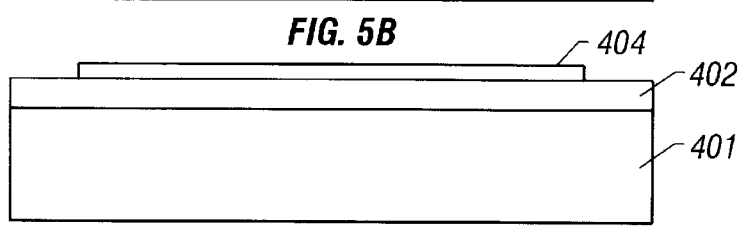

FIG. 5C shows a state that after amorphous silicon was converted into polysilicon in the active layer 403 that is formed on the substrate 401 through the undercoat film 402, the active layer 403 was patterned into an island 404. The island 404 was formed by patterning a resist by known photolithography and then etching the active layer 403 using a resist pattern as a mask. The etching may be performed by wet etching, dry etching, etc. In this embodiment, a parallel plate high-frequency plasma processing apparatus using $CF_4$ and $O_2$ was used.

Figure 5D:
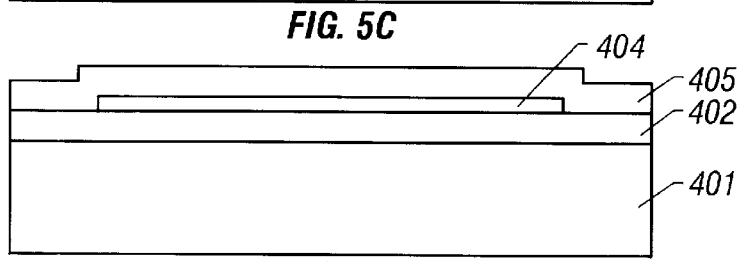
Figure 5E:
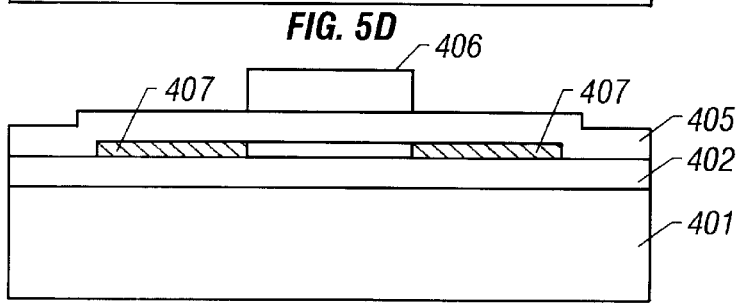

FIG. 5D shows a state that a gate insulating film 405 was so formed as to cover the island 404. The invention is applied to the formation of the gate insulating film 405 because the interface between the island 404 and the gate insulating film 405 greatly influences the characteristics of a TFT finally produced. In this connection, the cleaning of the island 404 before the formation of the gate insulating film 405 is very important. It was well known that organic substances such as carbon can be eliminated by cleaning with a solution obtained by adding sulfuric acid to a hydrogen peroxide solution or dry ashing with oxygen plasma. However, a study of the present assignee revealed that the elimination of carbon is not that simple.

As for sources of the carbon contamination, a photoresist that is used to form a desired pattern in a photolithographic process is a photosensitive organic substance and may cause carbon contamination. Thin film processes are now indispensable in manufacturing a semiconductor device, and a vacuum apparatus is absolutely necessary for such processes. Certain types of vacuum pumps for evacuating a vacuum apparatus still use oil, which likely causes carbon contamination. Other possible sources of the carbon contamination include vapor from a substrate carrier made of Teflon (PFA), polypropylene (PP), polyvinylidene fluoride (PVDF), ethylene trifluoride resin (ECTFE), ethylene tetrafluoride resin (ETFE), and polyethylene (PE), and floor and wall materials used in a clean room.

A conventional method is such that dry ashing is performed before a photolithographic step, organic substances are removed by applying, immediately before each step, a solution (heated to 80° C.) of a hydrogen peroxide solution and sulfuric acid (1:1) (hereinafter called wet ashing), and the next processing is performed immediately.

Although the previous understanding was such that almost all organic substances can be eliminated by the dry ashing and wet ashing, carbon contamination evaluation of substrate surfaces by a known XPS technique has revealed that only C—C bonds are scarcely removed.

Hydrogen radicals or hydrogen ions act effectively to eliminate C—C single bonds attached to the substrate surface. Although the use of only hydrogen radicals is sufficient, it has been found that the effect of eliminating C—C single bonds is enhanced by adding oxygen radicals, ozone, or oxygen ions. This is considered due to a phenomenon that hydrogen and oxygen radicals etc. react with carbon bonds to form such gases as $CH_x$, $CO_x$ and COH, that is, gasify carbon.

To generate hydrogen radicals or hydrogen ions, a substrate is placed in a parallel plate plasma apparatus, for instance. In this case, it is preferable to dispose the substrate on the anode side to prevent it from being damaged by plasma ions etc. It is also preferable that the apparatus be adapted to be able to heat a substrate, in which case the carbon elimination effect is enhanced by additional removal by heat.

Plasma is generated by introducing a hydrogen gas into the apparatus and applying high-frequency power between the parallel plates. Highly active, neutral hydrogen radicals are generated in the plasma, as well as hydrogen ions and electrons. While increasing the high-frequency power is effective to increase the amount of hydrogen radicals and ions, it can further be increased by utilizing electron cyclotron resonance with microwaves. Generated hydrogen radicals and ions reach the substrate surface, and react with C—C single bonds there to thereby eliminate carbon bonds. A resulting carbon gas is exhausted by a pump.

To clean the surface of the island 404, carbon contaminants are removed to some extent first by immersing, for 5–10 minutes, the substrate structure in a mixture of sulfuric acid and hydrogen peroxide solution (1:1; 80° C.), and then heavy metals were removed by immersing, for 5–10 minutes, the substrate structure in a mixture of hydrochloric acid and hydrogen peroxide solution (1:1; 80° C.). This type of cleaning is omitted if it adversely affects the substrate 401 etc. Then, to remove carbon contaminants containing carbon single bonds at least as their parts from the surface of the island 404, the substrate structure was placed in a plasma processing apparatus.

Since this plasma processing apparatus is also used to form a gate insulating film 405 after cleaning the island 404, it is desirable that the apparatus be so constructed as to allow the formation of the gate insulating film 405 and the removal of carbon contaminants containing carbon single bonds at least as their parts to be performed in the same reaction chamber. Examples of the apparatus which serves both as the apparatus for forming the gate insulating film 405 and as the plasma processing apparatus for removing carbon contaminants containing carbon single bonds at least as their parts are a parallel plate plasma CVD apparatus, a microwave plasma CVD apparatus utilizing electron cyclotron resonance, and an electrodeless discharge plasma CVD apparatus in which electrodes are arranged around a quartz chamber. In this embodiment, a parallel plate plasma CVD apparatus was used.

To effect plasma processing for removing carbon contaminants containing carbon single bonds at least as their parts, the substrate 401 formed with the island 404 was placed on the anode side of the parallel plate plasma processing apparatus. The interval between the anode and the cathode (parallel plate electrodes) was adjusted in a range of 30–150 mm. The typical interval was 70 mm. No serious problems occurred even with an interval larger or smaller than 70 mm if the conditions were selected properly. Gases were introduced into the reaction space through the cathode electrode that was so constructed as to serve as a shower head. The shower head was provided with a dispersing plate or the like so that gases were uniformly applied to the surface of the substrate 401. A hydrogen gas and an oxygen gas were introduced by the same amount. The gas amounts were so set that the plasma processing pressure became 50 mTorr to 10 Torr and the gas residence time became less than 5 seconds though these values depend on the size of the processing chamber. The residence time was set less than 5 seconds to quickly exhaust removed carbon because there sometimes occurred re-attachment of gasified carbon. However, there occurred no problems if the residence time was less than about 10 seconds. For example, the residence time is about 10 seconds if a gas is introduced at 316 SCCM into a chamber of 40 liters at a pressure of 1 Torr, since the residence time is equal to the product of the chamber capacity and the chamber pressure divided by the gas flow rate. Therefore, to decrease the residence time, it is necessary to reduce the chamber capacity or pressure or increasing the gas flow rate.

In this embodiment, the residence time was set at about 4 seconds by making the chamber capacity, processing pressure, and the flow rates of oxygen and hydrogen 40 liters 1 Torr, 400 SCCM, and 400 SCCM, respectively.

Plasma was generated by high-frequency discharge. The frequency of the high-frequency power was set at 10–100 MHz, and at 20 MHz in this embodiment. The application power was 0.1–2 W/cm². If the power is lower than 0.1 W/cm², the processing time becomes too long though carbon can be eliminated. On the other hand, if the power is higher than 2 W/cm², the electrodes are heated. Since it is necessary to cool the electrodes, the apparatus becomes large and expensive. In this embodiment, power of 0.8 W/cm² was applied. The carbon removal ability is improved by heating the substrate, typically to 200–500° C. Although a sufficient carbon removal effect is obtained in a range from the room temperature to 200° C., the substrate temperature was set at 300–400° C. which is the same as a substrate temperature in forming the gate insulating film 405 subsequently. The plasma processing time was about 1–10 minutes. The plasma processing time varies very much with various conditions such as the gas residence time, the frequency of high-frequency power, the application power, and the substrate temperature. It should not be too long when considered part of the time of a manufacturing process. In this embodiment, it was set at 2 minutes.

$H_2O$ may be used to generate hydrogen radicals etc. and oxygen radicals etc. instead of using hydrogen and oxygen gases. $H_2O$ can be introduced in several manners. One method is to bubble $H_2O$ in a tank with an inert carrier gas such as He, Ne or Ar and then transport a resulting $H_2O$ gas to the processing chamber. Another method is to transport a $H_2O$ gas to the processing chamber by increasing its vapor pressure by heating the entire pipe from a $H_2O$ tank to the processing chamber. $H_2O$ as introduced is decomposed by plasma to generate hydrogen ions, hydrogen radicals, oxygen ions, oxygen radicals, and ozone at the same time. Similar effects were obtained by bubbling $H_2O$ in a tank with a He carrier gas that was supplied at 500–1,000 SCCM.

After the step of eliminating carbon contaminants containing carbon single bonds at least as their parts, the gate insulating film 405 was formed by using ethyl orthosilicate (also called TEOS), oxygen, and hydrogen. It is effective to use other types of organic silane such as OMCTS (octamethylcyclotetrasiloxane) and HMDS (hexamethyldisiloxane) instead of ethyl orthosilicate. The substrate temperature was set at 200–500° C., typically 300–400° C. The film forming pressure was set at 0.1–2 Torr, typically 0.5–1 Torr. The frequency of the plasma power supply was 5–50 MHz, typically 20 MHz, and its supply power was 0.1–2 W/cm$^2$, typically 0.3–0.5 W/cm$^2$. The ratio of ethyl orthosilicate to oxygen was set at 1:5–20, typically 1:10. As for the amount of hydrogen, the ratio of ethyl orthosilicate to hydrogen was set at 1:0.01–1, typically 1:0.5. The gate insulating film 405 was formed at a thickness of 250–2,000 Å, typically 500–1,200 Å.

During the film formation, carbon was removed being gasified into $CH_x$, and COH by hydrogen radicals and hydrogen ions. After completion of the above step, the carbon content in the gate insulating film 405 was measured by SIMS. Whereas oxide films that were formed as the gate insulating film 405 without adding hydrogen had a minimum carbon content value in a depth-direction profile of $1\times10^{19}$ cm$^{-3}$, oxide films that was formed as the gate insulating film 405 with the addition of hydrogen had a corresponding value of $2\times10^{18}$ to $7\times10^{18}$ cm$^{-3}$.

A gate electrode film was formed on the gate insulating film 405, and then patterned into a gate electrode 406. Impurity regions for a source and a drain 407 were then formed to provide a state of FIG. 5E. More specifically, after a conductive film of Al, doped polysilicon, Cr, Ta, or the like was laid, a resist film was patterned by photolithography. The gate electrode 406 was formed by etching the conductive film into a desired shape by using the resist pattern as a mask. In this embodiment, an Al film was formed by sputtering. Thereafter, the source and drain 407 were formed by through-doping the island 404 with phosphorus by ion implantation at a dose of $5\times10^{15}$ cm$^{-2}$. Instead of using ion implantation, $PH_x$ may be implanted by plasma doping. After the implantation, the substrate structure was heated at 600° C. for 5 hours to activate the implanted ions. A doped polysilicon film may be deposited to form the gate electrode 406 with polysilicon rather than metal. It is also possible to deposit a non-doped polysilicon film and then dope it by ion implantation or plasma doping to form the source and drain 407.

Figure 5F:
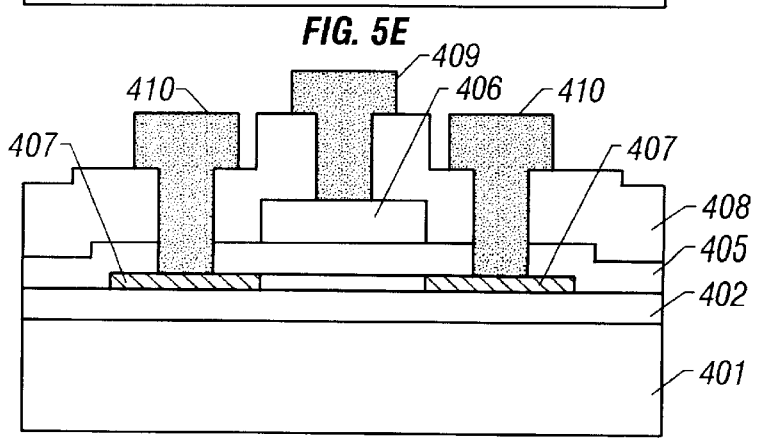

Subsequently, an interlayer insulating film 408 was formed, and a contact electrode 409 for the gate electrode 406 and contact electrodes 410 for the source and drain 407 were formed. Thus, a top-gate polysilicon thin-film transistor was completed as shown in FIG. 5F. The invention was used in forming the interlayer insulating film 408. In forming the interlayer insulating film 408 by atmospheric pressure CVD, carbon can be eliminated during the film formation by generating hydrogen radicals by a catalyst method and using those during the film formation. The invention is also effective in an atmospheric pressure CVD method using organic silane. In the case of applying the invention to film formation by atmospheric pressure CVD, a catalyst method is used to convert hydrogen to hydrogen radicals. Proper examples of the catalyst include 3d-transition metals such as platinum, palladium, reduced nickel, cobalt, titanium, vanadium, and tantalum; compounds of metals such as aluminum, nickel, platinum-silicon, platinum-chlorine, platinum-rhenium, nickel-molybdenum, and cobalt-molybdenum; and mixtures or compounds of any of the above transition metals and alumina or silica gel. In addition, Raney catalysts of cobalt, ruthenium, palladium, nickel, and the like, and mixtures or compounds of any of those Raney catalysts and carbon can be used. These catalysts are used in a granulated, reticular, or powder state. Materials having a low melting point and markedly increasing the initial absorption rate of a reactive substance, and materials containing alkali metals such as sodium which easily vaporize are not suitable for the catalyst. Examples of such unfavorable materials are copper and tungsten. Experiments revealed considerable degradation of a catalyst at a temperature higher than the decomposition temperature of a reactive substance. The amount and the density of a catalyst depend on the effective contact area with a reactive gas, and may be adjusted when necessary. Active hydrogen radicals are generated by passing hydrogen through a catalyst being heated. Active ozone is generated by passing oxygen through an ozonizer.

In an atmospheric CVD apparatus in which the substrate structure is heated, ethyl orthosilicate is introduced into the apparatus by bubbling it contained in a tank with a carrier gas such as nitrogen. Oxygen is introduced into the apparatus through the ozonizer. Hydrogen is introduced into the apparatus through the catalyst. All of those gases are supplied to the substrate structure in a mixed state from a gas nozzle having a dispersing mechanism. It is very effective to introduce hydrogen by an amount 0.01 to 1 times the amount of the $N_2$ carrier gas. Where ethyl orthosilicate is directly gasified by heating it, the effects are enhanced when hydrogen is introduced by an amount 0.1 to 1 times the amount of the ethyl orthosilicate. In this embodiment, hydrogen radicals were generated from hydrogen by using Ni with a catalyst temperature of 500° C. The amount of hydrogen was set at 0.3–0.8 times the amount of the $N_2$ carrier gas. The substrate temperature was set at 350° C. Thus, the interlayer insulating film 408 was formed at a thickness of 7,000–15,000 Å, typically 9,000–12,000 Å.

Although in this embodiment all of the undercoat film 402, the gate insulating film 405, and the interlayer insulating film 408 are oxide films formed by using organic silane, only one those films may be an oxide film formed according to the embodiment. That is, since in the embodiment an oxide film is formed by removing carbon during the film formation that uses an organic silane type gas, the embodiment need not be used in film formation in which organic silane is not used. Further, where a film property other than a small carbon content is important, the use of an oxide film of the invention may be avoided. For example, only the undercoat film 402 and the interlayer insulating film 408 may be oxide films formed according to the invention, while the gate insulating film 405 is a thermal oxidation film or an oxide film formed by using silane and oxygen. Other various combinations of oxide films are also possible.

TFTs completed by using oxide films of the embodiment had a channel length of 8 μm and a channel width of 100 μm. As for the characteristics, the mobility was 153 cm$^2$/Vs in the case of N-channel TFTs and 119 cm$^2$/Vs in the case of P-channel TFTs, and the kink effect was not observed at all. No variation occurred in moisture resistance after TFTs were left in an atmosphere of 150° C. and 60% RH for 12 hours. The moisture resistance should have been further improved if TFTs had a $SiN_x$ protection film as in an ordinary case. Thus, TFTs were improved in characteristics and reliability because the carbon content was greatly reduced in all of the undercoat film 402, the gate insulating film 405, and the interlayer insulating film 408 as compared to the case where oxide films of the embodiment were not used.

Embodiment 6

This embodiment is directed to a case of forming nitrogen-added oxide films as an undercoat film 402, a gate insulating film 405, an interlayer insulating film 408 in the thin-film transistor manufacturing process using polysilicon shown in FIGS. 5A–5F. A manufacturing process of this embodiment will be described with reference to FIGS. 5A–5F, but the same steps as in the fifth embodiment will not be described.

An undercoat film 402 was formed by using a parallel plate plasma CVD apparatus and gases of ethyl orthosilicate (also called TEOS), NO, and hydrogen. It is effective to use other types of organic silane such as OMCTS (octamethylcyclotetrasiloxane) and HMDS (hexamethyldisiloxane) instead of ethyl orthosilicate. The substrate temperature was set at 200–500° C., typically 400° C. The film forming pressure was set at 0.1–2 Torr, typically 1 Torr. The frequency of the plasma power supply was 5–50 MHz, typically 20 MHz, and its supply power was 0.1–2 W/cm$^2$, typically 0.3 W/cm$^2$. The ratio of ethyl orthosilicate to NO was set at 1:5–20, typically 1:5. As for the amount of hydrogen, the ratio of ethyl orthosilicate to hydrogen was set at 1:0.01–1, typically 1:0.5. The undercoat film 402 was formed at a thickness of 500–3,000 Å, typically 2,000 Å.

It is very effective to remove carbon during the formation of the undercoat film 402 by hydrogen radicals and hydrogen ions in any plasma CVD method even other than the parallel plate plasma CVD, if an oxide film is formed by using organic silane.

In forming the undercoat film 402 by atmospheric pressure CVD, carbon can also be eliminated during the film formation by generating hydrogen radicals by a catalyst method and using those during the film formation. The invention is also effective in an atmospheric pressure CVD method using organic silane.

The kink effect is prevented or reduced in possibility of occurrence by using the invention in forming the undercoat film 402. The possibility of occurrence of the kink effect is small if the undercoat film 402 is a SiO$_x$ film that does not contain impurities. It is necessary to block diffusion of impurities from the substrate 401.

In an atmospheric CVD apparatus in which the substrate structure is heated, ethyl orthosilicate is introduced into the apparatus by bubbling it contained in a tank with a carrier gas such as nitrogen oxide. Oxygen is introduced into the apparatus through an ozonizer. Hydrogen is introduced into the apparatus through a catalyst. All of those gases are supplied to the substrate structure in a mixed state from a gas nozzle having a dispersing mechanism.

In forming a film by atmospheric pressure CVD by using only ethyl orthosilicate and ozone, an oxide film is formed much differently depending on whether the surface of a substrate is hydrophilic or hydrophobic. While a clean film can be formed on a substrate having a hydrophobic surface, abnormal film formation or reduction in film forming rate likely occurs with a hydrophilic surface.

The invention, which is associated with the use of hydrogen radicals, can not only provide the decarbonization effect but also prevent abnormal film formation and reduction in film forming rate because active hydrogen terminates the substrate surface to thereby create a hydrophobic surface. In particular, these effects are remarkable when hydrogen is introduced by an amount 0.01 to 1 times the amount of nitrogen oxide. Where ethyl orthosilicate is directly gasified by heating it, these effects are enhanced when hydrogen is introduced by an amount 0.1 to 1 times the amount of the ethyl orthosilicate.

FIG. 5D shows a state that a gate insulating film 405 was so formed as to cover an island 404. The invention is applied to the formation of the gate insulating film 405 itself because the interface between the island 404 and the gate insulating film 405 greatly influences the characteristics of a TFT finally produced. In this connection, the cleaning of the island 404 before the formation of the gate insulating film 405 is very important. It was well known that organic substances such as carbon can be eliminated by cleaning with a solution obtained by adding sulfuric acid to a hydrogen peroxide solution or dry ashing with oxygen plasma. However, a study of the present assignee revealed that the elimination of carbon is not that simple.

After a step of eliminating carbon contaminants containing carbon single bonds at least as their parts, the gate insulating film 405 was formed by using ethyl orthosilicate (also called TEOS) as the organic silane type source gas and N$_2$O as nitrogen oxide. It is effective to use other types of organic silane such as OMCTS (octamethylcyclotetrasiloxane) and HMDS (hexamethyldisiloxane) instead of ethyl orthosilicate. The substrate temperature was set at 200–500° C., typically 300–400° C. The film forming pressure was set at 0.1–2 Torr, typically 0.5–1 Torr. The frequency of the plasma power supply was 5–50 MHz, typically 20 MHz, and its supply power was 0.1–2 W/cm$^2$, typically 0.3–0.5 W/cm$^2$.

The ratio of ethyl orthosilicate to N$_2$O was set at 1:5–20, typically 1:10. As for the amount of hydrogen, the ratio of ethyl orthosilicate to hydrogen was set at 1:0.01–1, typically 1:0.5. The gate insulating film 405 was formed at a thickness of 250–2,000 Å, typically 500–1,200 Å. During the film formation, carbon was exhausted from the chamber being gasified into CH$_x$ and COH by hydrogen radicals and hydrogen ions.

After completion of the above step, the carbon content in the gate insulating film 405 was measured by SIMS. Whereas oxide films that were formed as the gate insulating film 405 without adding hydrogen had a minimum carbon content value in a depth-direction profile of 1×10$^{19}$ cm$^{-3}$, oxide films that was formed as the gate insulating film 405 with the addition of hydrogen had a corresponding value of 2×10$^{18}$ to 7×10$^{18}$ cm$^{-3}$.

In forming an interlayer insulating film 408, carbon can be eliminated during the film formation by generating hydrogen radicals by a catalyst method and using those during the film formation. The invention is also effective in an atmospheric pressure CVD method using organic silane.

In the case of applying the invention to film formation by atmospheric pressure CVD, a catalyst method is used to convert hydrogen to hydrogen radicals. Active hydrogen radicals are generated by passing hydrogen through a catalyst being heated. Active ozone is generated by passing oxygen through an ozonizer.

In an atmospheric CVD apparatus in which the substrate structure is heated, ethyl orthosilicate is introduced into the apparatus by bubbling it contained in a tank with nitrogen oxide such as N$_2$O. Oxygen is introduced into the apparatus through the ozonizer. Hydrogen is introduced into the apparatus through the catalyst. All of those gases are supplied to the substrate structure in a mixed state from a gas nozzle having a dispersing mechanism. It is very effective to introduce hydrogen by an amount 0.01 to 1 times the amount of nitrogen oxide. Where ethyl orthosilicate is directly gasified by heating it, the effects are enhanced when hydrogen is introduced by an amount 0.1 to 1 times the amount of the ethyl orthosilicate. In this embodiment, hydrogen radicals were generated from hydrogen by using Ni with a catalyst temperature of 500° C. The amount of hydrogen was set at 0.3–0.8 times the amount of nitrogen oxide. The substrate temperature was set at 350° C. Thus, the interlayer insulating film 408 was formed at a thickness of 7,000–15,000 Å, typically 9,000–12,000 Å.

Although in this embodiment all of the undercoat film 402, the gate insulating film 405, and the interlayer insulating film 408 are oxide films formed by using organic silane with the addition of nitrogen, only one of those films may be an oxide film formed according to the embodiment. That is, since in the embodiment an oxide film is formed by removing carbon during the film formation that uses an organic silane type gas and has an alkali metal blocking effect, the embodiment need not be used in film formation in which organic silane is not used. Further, where a film property other than a small carbon content is important, the use of an oxide film of the invention may be avoided. For example, only the undercoat film 402 and the interlayer insulating film 408 may be oxide films formed according to the invention, while the gate insulating film 405 is a thermal oxidation film or an oxide film formed by using silane and oxygen. Other various combinations of oxide films are also possible.

TFTs completed by using the embodiment had a channel length of 8 μm and a channel width of 100 μm. As for the characteristics, the mobility was 153 $cm^2/Vs$ in the case of N-channel TFTs and 119 $cm^2/Vs$ in the case of P-channel TFTs, and the kink effect was not observed at all. No variation occurred in moisture resistance after TFTs were left in an atmosphere of 150° C. and 60% RH for 12 hours. The moisture resistance should have been further improved if TFTs had a $SiN_x$ protection film as in an ordinary case. Thus, TFTs were improved in characteristics and reliability because the carbon content was greatly reduced and an improved blocking effect with respect to impurities such as alkali metals was obtained in all of the undercoat film 402, the gate insulating film 405, and the interlayer insulating film 408 as compared to the case where oxide films of the embodiment were not used.

Embodiment 7

This embodiment is directed to a case in which the invention is applied to formation of an insulating film for burying and planarizing line-and-space wiring lines that are arranged side by side.

Figure 6:
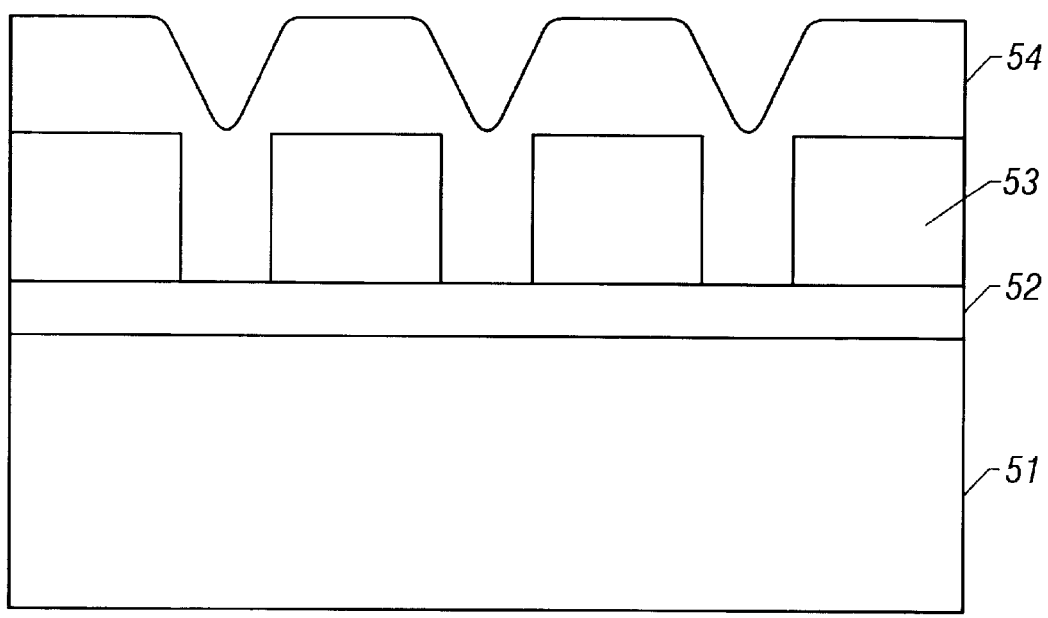
FIG. 6 shows how metal wiring lines are buried according to seventh and eighth embodiments of the invention.

FIG. 6 shows how metal wiring lines are buried.

A thermal oxidation film 52 is formed on a semiconductor substrate 51, metal wiring lines 53 are formed thereon, and a burying insulating film 54 is further formed thereon. Although a single crystal silicon wafer is mainly used as the semiconductor substrate 51, it may be a compound semiconductor substrate such as a GaAs substrate or a polycrystalline semiconductor substrate. In this embodiment, a P-type silicon wafer of the (100) plane is used. The thermal oxidation film 52 may be either a film formed by wet oxidation or a film formed by dry oxidation. In this embodiment, the thermal oxidation film 52 was grown by dry oxidation at a thickness of about 500 Å over the entire surface of the semiconductor substrate 51. To form the metal wiring lines 53 thereon, an Al film was deposited by sputtering. The Al sputtering was performed by using a target containing Si at 2% to prevent Al hillocks. The Al film was shaped by anisotropic dry etching into the metal wiring lines 53 of 1 μm both in thickness and height (aspect ratio: 1). The wiring line interval was varied in a range of 0.3–1.0 μm.

The invention was used in forming the insulating film 54. While film forming methods according to the invention using organic silane include a plasma CVD method and an atmospheric pressure CVD method, in this embodiment the insulating film 54 was formed by the atmospheric pressure CVD method. In forming the insulating film 54 by atmospheric pressure CVD, carbon can be eliminated during the film formation by generating hydrogen radicals by a catalyst method and using those during the film formation. The invention is also effective in an atmospheric pressure CVD method using organic silane. In the case of applying the invention to film formation by atmospheric pressure CVD, a catalyst method is used to convert hydrogen to hydrogen radicals. Proper examples of the catalyst include 3d-transition metals such as platinum, palladium, reduced nickel, cobalt, titanium, vanadium, and tantalum; compounds of metals such as aluminum, nickel, platinum-silicon, platinum-chlorine, platinum-rhenium, nickel-molybdenum, and cobalt-molybdenum; and mixtures or compounds of any of the above transition metals and alumina or silica gel. In addition, Raney catalysts of cobalt, ruthenium, palladium, nickel, and the like, and mixtures or compounds of any of those Raney catalysts and carbon can be used. These catalysts are used in a granulated, reticular, or powder state. Materials having a low melting point and markedly increasing the initial absorption rate of a reactive substance, and materials containing alkali metals such as sodium which easily vaporize are not suitable for the catalyst. Examples of such unfavorable materials are copper and tungsten. Experiments revealed considerable degradation of a catalyst at a temperature higher than the decomposition temperature of a reactive substance. The amount and the density of a catalyst depend on the effective contact area with a reactive gas, and may be adjusted when necessary. Active hydrogen radicals are generated by passing hydrogen through a catalyst being heated. Active ozone is generated by passing oxygen through an ozonizer. In an atmospheric CVD apparatus in which the substrate structure is heated, ethyl orthosilicate is introduced into the apparatus by bubbling it contained in a tank with a carrier gas such as nitrogen. Oxygen is introduced into the apparatus through the ozonizer. Hydrogen is introduced into the apparatus through the catalyst. All of those gases are supplied to the substrate structure in a mixed state from a gas nozzle having a dispersing mechanism.

In forming a film by atmospheric pressure CVD by using only ethyl orthosilicate as organic silane and ozone, an oxide film is formed much differently depending on whether the surface of a substrate is hydrophilic or hydrophobic. While a clean film can be formed on a substrate having a hydrophobic surface, abnormal film formation or reduction in film forming rate likely occurs with a hydrophilic surface. In the case of forming the insulating film 54, it can be formed on the metal wiring lines 53 without causing any problems. However, since the surface of the thermal oxidation film 52 is hydrophilic, abnormal film formation likely occurs conventionally unless low-density ozone is used at the initial stage of film formation and then high-density ozone is used. That is, conventionally, there are problems when a film is formed on at least part of a hydrophilic surface. In contrast, the invention, which is associated with the use of hydrogen radicals, can not only provide the decarbonization effect but also prevent abnormal film formation and reduction in film forming rate because active hydrogen terminates the substrate surface to thereby create a hydrophobic surface. Therefore, in the invention, film formation can be performed without changing the ozone density from the initial stage to the end of the film formation, to provide a thickness-direction profile having only a small variation. In this embodiment, the film formation was performed with the ozone density set at 1.5–3%

A F-doped $SiO_x$ film having a low carbon content and a smaller permittivity than non-doped $SiO_x$ can be formed by using organic silane containing fluorine such as FSi $(OC_2H_6)_4$ instead of ethyl orthosilicate. Therefore, it is possible to reduce a lateral capacitance between wiring lines of an LSI. These effects are remarkable when hydrogen is introduced by an amount 0.01 to 1 times the amount of the $N_2$ carrier gas. Where ethyl orthosilicate is directly gasified by heating it, these effects are enhanced when hydrogen is introduced by an amount 0.1 to 1 times the amount of the ethyl orthosilicate.

In completed structures of this embodiment, the metal wiring lines 53 were buried completely by the insulating film 54 when the wiring line interval was 0.5–1.0 μm. According to the conventional methods without addition of hydrogen, the burying was complete when low-density ozone (less than 1%) was used at the initial stage of film formation and then the ozone density was increased. However, when high-density ozone (more than 1%) was used from the initial stage of film formation, abnormal film formation occurred on the thermal oxidation film 52 and burying could not be effected. Where the wiring line interval was 0.3–0.5 μm, burying could not be effected completely (the performance became worse as the interval became closer to 0.3 μm) irrespective of the use of the invention. This would indicate the limit of the atmospheric pressure CVD as a film forming method.

The hygroscopicity of completed films were evaluated after they were left in an atmosphere of 60° C. and 80% RH for 50 hours. No infrared absorption mode due to moisture absorption was detected in films formed according to the invention. In contrast, a Si—OH infrared absorption mode was detected in the vicinity of 3,660 cm$^{-1}$ in all films that were formed without using the invention.

Embodiment 8

This embodiment is directed to a case in which the invention is applied to formation of an insulating film for burying and planarizing line-and-space wiring lines that are arranged side by side. In this embodiment, an insulating film 54 is an oxide film formed by adding nitrogen.

FIG. 6 shows how metal wiring lines are buried. As in the case of the seventh embodiment, a thermal oxidation film 52 of about 500 Å in thickness is formed on a semiconductor substrate 51, and metal wiring lines 53 are formed thereon. The metal wiring lines 53 were formed by patterning an Al film by anisotropic dry etching into wiring lines of 1 μm both in thickness and height (aspect ratio: 1). The wiring line interval was varied in a range of 0.3–1.0 μm.

The invention was used in forming the insulating film 54. While film forming methods according to the invention using organic silane include a plasma CVD method and an atmospheric pressure CVD method, in this embodiment the insulating film 54 was formed by the atmospheric pressure CVD method. In forming the insulating film 54 by atmospheric pressure CVD, carbon can be eliminated during the film formation by generating hydrogen radicals by a catalyst method and using those during the film formation. The invention is also effective in an atmospheric pressure CVD method using organic silane.

In the case of applying the invention to film formation by atmospheric pressure CVD, a catalyst method is used to convert hydrogen to hydrogen radicals as in the case of the seventh embodiment.

Active hydrogen radicals are generated by passing hydrogen through a catalyst being heated. Active ozone is generated by passing oxygen through an ozonizer. In an atmospheric CVD apparatus in which the substrate structure is heated, HMDS contained in a tank is bubbled with $N_2O$. Oxygen is introduced into the apparatus through the ozonizer. Hydrogen is introduced into the apparatus through the catalyst. All of those gases are supplied to the substrate structure in a mixed state from a gas nozzle having a dispersing mechanism.

In forming a film by atmospheric pressure CVD by using only HMDS as organic silane and ozone, an oxide film is formed much differently depending on whether the surface of a substrate is hydrophilic or hydrophobic. While a clean film can be formed on a substrate having a hydrophobic surface, abnormal film formation or reduction in film forming rate likely occurs with a hydrophilic surface.

In the case of forming the insulating film 54, it can be formed on the metal wiring lines 53 without causing any problems. However, since the surface of the thermal oxidation film 52 is hydrophilic, abnormal film formation likely occurs conventionally unless low-density ozone is used at the initial stage of film formation and then high-density ozone is used. That is, conventionally, there are problems when a film is formed on at least part of a hydrophilic surface. In contrast, the invention, which is associated with the use of hydrogen radicals, can not only provide the decarbonization effect but also prevent abnormal film formation and reduction in film forming rate because active hydrogen terminates the substrate surface to thereby create a hydrophobic surface. Therefore, in the invention, film formation can be performed without changing the ozone density from the initial stage to the end of the film formation, to provide a thickness-direction profile having only a small variation. In this embodiment, the film formation was performed with the ozone density set at 1.5–3%

A F-doped $SiO_x$ film having a low carbon content and a smaller permittivity than non-doped $SiO_x$ can be formed by using organic silane containing fluorine such as FSi $(OC_2H_6)_4$ instead of ethyl orthosilicate. Therefore, it is possible to reduce a lateral capacitance between wiring lines of an LSI. These effects are remarkable when hydrogen is introduced by an amount 0.01 to 1 times the amount of nitrogen oxide. Where organic silane such as HMDS is directly gasified by heating it, these effects are enhanced when hydrogen is introduced by an amount 0.1 to 1 times the amount of the ethyl orthosilicate. However, in this case, care should be taken not to excessively increase the amount of nitrogen oxide such as $N_2O$ to avoid an increase in permittivity.

In completed structures of this embodiment, the metal wiring lines 53 were buried completely by the insulating film 54 when the wiring line interval was 0.5–1.0 μm. According to the conventional methods without addition of hydrogen, the burying was complete when low-density ozone (less than 1%) was used at the initial stage of film formation and then the ozone density was increased. However, when high-density ozone (more than 1%) was used from the initial stage of film formation, abnormal film formation occurred on the thermal oxidation film 52 and burying could not be effected. Where the wiring line interval was 0.3–0.5 μm, burying could not be effected completely (the performance became worse as the interval became closer to 0.3 μm irrespective of the use of the invention. This would indicate the limit of the atmospheric pressure CVD as a film forming method.

The hygroscopicity of completed films were evaluated after they were left in an atmosphere of 60° C. and 80% RH for 50 hours. No infrared absorption mode due to moisture absorption was detected in films formed according to the invention. In contrast, a Si—OH infrared absorption mode was detected in the vicinity of 3,660 $cm^{-1}$ in all films that were formed without using the invention.

The invention provides a semiconductor device manufacturing method which enables formation of a film that is superior in step coverage, lower in carbon content than conventional films, and low in hygroscopicity, thereby improving the characteristics and the reliability of a semiconductor device. The invention also provides a semiconductor device manufacturing apparatus to implement the above manufacturing method. By using this apparatus, it becomes possible to eliminate carbon during film formation using an organic silane type source gas.

Further, by using an oxide film formed according to the invention, there can be obtained superior step coverage, a lower carbon content than in conventional films, low hygroscopicity, superior performance of blocking impurities such as alkali metals, and other superior characteristics, whereby the characteristics and the reliability of a semiconductor device can be improved.

The invention also provides a semiconductor device manufacturing apparatus to implement the above manufacturing method for improving the characteristics and the reliability of a semiconductor device. By using this apparatus, it becomes possible to eliminate carbon during film formation using an organic silane type source gas.

What is claimed is:

1. A manufacturing method of a semiconductor device comprising the steps of:

placing a substrate in a reaction chamber;

passing $H_2$ through a heated catalyst to form a hydrogen radical;

introducing an organic silane type source gas and an oxidizing gas and said hydrogen radical into said reaction chamber at a flow rate ratio of organic silane type source gas: oxidizing gas:hydrogen radical= 1:5–20:0.01–1 in terms of SCCM; and forming an oxide film over said substrate by atmospheric pressure CVD by using said organic silane type source gas and said oxidizing gas and said hydrogen radical.

2. The method of claim 1 wherein the organic silane type source gas is one of TEOS, OMCTS, and HMDS.

3. The method of claim 1 wherein the organic silane type source gas is a material including fluorine.

4. The method of claim 1 wherein said substrate is heated.

5. The method of claim 1 wherein said substrate comprises a glass.

6. A manufacturing method of a semiconductor device comprising the steps of:

placing a substrate in a reaction chamber;

passing $H_2$ through a heated catalyst to form a hydrogen radical;

introducing an organic silane type source gas and oxidizing gas and said hydrogen radical into said reaction chamber at a flow rate ratio of organic silane type source gas:oxidizing gas:hydrogen radical= 1:5–20:0.01–1 in terms of SCCM;

forming an undercoat oxide film over said substrate by atmospheric pressure CVD by using said organic silane type source gas and said oxidizing gas and said hydrogen radical; and forming a semiconductor layer to become an active layer of a thin film transistor over said undercoat oxide.

7. The method of claim 6 wherein the organic silane type source gas is one of TEOS, OMCTS, and HMDS.

8. The method of claim 6 wherein the organic silane type source gas is a material including fluorine.

9. The method of claim 6 wherein said substrate is heated.

10. The method of claim 6 wherein said substrate comprises a glass.

11. A manufacturing method of a semiconductor device comprising the steps of:

forming a semiconductor layer to become an active layer of a thin film transistor over a substrate;

placing said semiconductor layer formed over said substrate in a reaction chamber;

passing $H_2$ through a heated catalyst to form a hydrogen radical;

introducing an organic silane type source gas and an oxidizing gas and hydrogen radical into said reaction chamber at a flow rate ratio of organic silane type source gas:oxidizing gas:hydrogen radical= 1:5–20:0.01–1 in terms of SCCM; and forming an oxide film as an interlayer insulating film over said semiconductor layer by atmospheric pressure CVD by using said organic silane type source gas and said oxidizing gas and said hydrogen radical.

12. The method of claim 11 wherein the organic silane type source gas is one of TEOS, OMCTS, and HMDS.

13. The method of claim 11 wherein the organic silane type source gas is a material including fluorine.

14. The method of claim 11 wherein said substrate is heated.

15. The method of claim 11 wherein said substrate comprises a glass.

* * * * *